(12) United States Patent
Kim et al.

(10) Patent No.: US 9,666,804 B2
(45) Date of Patent: *May 30, 2017

(54) COPOLYMER AND ORGANIC SOLAR CELL USING SAME

(71) Applicant: LG CHEM, LTD., Seoul (KR)

(72) Inventors: Jinseck Kim, Daejeon (KR); Jaesoon Bae, Daejeon (KR); Jaechol Lee, Daejeon (KR); Jeong Min Choi, Daejeon (KR); Jiyoung Lee, Daejeon (KR); Hangken Lee, Daejeon (KR); Songrim Jang, Daejeon (KR); Keun Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 12 days.

This patent is subject to a terminal disclaimer.

(21) Appl. No.: 14/391,132

(22) PCT Filed: Dec. 9, 2013

(86) PCT No.: PCT/KR2013/011334
§ 371 (c)(1),
(2) Date: Oct. 7, 2014

(87) PCT Pub. No.: WO2014/092408
PCT Pub. Date: Jun. 19, 2014

(65) Prior Publication Data
US 2015/0114468 A1    Apr. 30, 2015

(30) Foreign Application Priority Data

Dec. 10, 2012 (KR) .................. 10-2012-0143044

(51) Int. Cl.
*C08G 75/00* (2006.01)
*H01L 51/00* (2006.01)
(Continued)

(52) U.S. Cl.
CPC ........ *H01L 51/0036* (2013.01); *C08G 61/123* (2013.01); *C08G 61/126* (2013.01);
(Continued)

(58) Field of Classification Search
CPC .................. C08F 14/18; C08F 214/18; C08G 2261/3243; C08G 2261/3223;
(Continued)

(56) References Cited

U.S. PATENT DOCUMENTS

2008/0087324 A1   4/2008   Gaudiana et al.
2011/0003967 A1   1/2011   Amb et al.
(Continued)

FOREIGN PATENT DOCUMENTS

CN   102812016 A   12/2012
JP   2001527102 A  12/2001
(Continued)

OTHER PUBLICATIONS

Beate Burkhart et al., "Semi-Random Two-Acceptor Polymers: Elucidating Electronic Trends Through Multiple Acceptor Combinations", Macromolecular Chemistry and Physics, 2013, p. 681-690, vol. 214(6).
(Continued)

*Primary Examiner* — Shane Fang
(74) *Attorney, Agent, or Firm* — Dentons US LLP

(57) ABSTRACT

The present specification provides a copolymer, and an organic solar cell including one or more layers of organic material layers that include the copolymer.

20 Claims, 10 Drawing Sheets

(51) Int. Cl.
    *C08G 61/12*     (2006.01)
    *C08G 75/32*     (2006.01)
    *C08L 65/00*     (2006.01)
    *C08K 3/04*     (2006.01)
    *H01L 51/42*     (2006.01)

(52) U.S. Cl.
    CPC .......... *C08G 75/32* (2013.01); *H01L 51/0043* (2013.01); *H01L 51/424* (2013.01); *C08G 2261/1412* (2013.01); *C08G 2261/3223* (2013.01); *C08G 2261/3243* (2013.01); *C08G 2261/3246* (2013.01); *C08G 2261/344* (2013.01); *C08G 2261/411* (2013.01); *C08G 2261/91* (2013.01); *C08K 3/04* (2013.01); *C08L 65/00* (2013.01); *H01L 51/0047* (2013.01); *H01L 51/4253* (2013.01); *Y02E 10/549* (2013.01)

(58) Field of Classification Search
    CPC .......... C08G 2261/414; C08G 2261/91; C08G 2261/124; H01L 51/0043; H01L 51/0094; H01L 51/4253; Y02E 10/549
    USPC .................... 528/377, 380, 373, 37
    See application file for complete search history.

(56) References Cited

U.S. PATENT DOCUMENTS

| | | |
|---|---|---|
| 2011/0204341 A1 | 8/2011 | Brown et al. |
| 2012/0152357 A1 | 6/2012 | Brown |
| 2012/0153274 A1* | 6/2012 | Sonar .................. H01L 51/0036 257/40 |
| 2012/0305853 A1 | 12/2012 | Mitchell et al. |
| 2013/0167929 A1 | 7/2013 | Wen et al. |
| 2013/0267657 A1 | 10/2013 | Zhou |
| 2013/0276887 A1 | 10/2013 | Worfolk et al. |

FOREIGN PATENT DOCUMENTS

| | | |
|---|---|---|
| JP | 2009-158921 | 7/2009 |
| JP | 2011-168747 | 9/2011 |
| WO | 9932537 A1 | 7/1999 |
| WO | 2011/028827 A2 | 3/2011 |
| WO | 2012/030942 A1 | 3/2012 |
| WO | 2012/058209 A1 | 5/2012 |
| WO | 2012/071641 A1 | 6/2012 |
| WO | 2012/088698 A1 | 7/2012 |

OTHER PUBLICATIONS

Wonho Lee et al., "Efficient Conventional- and Inverted-Type Photovoltaic Cells Using a Planar Alternating Polythiophene Copolymer", Chemistry—A European Journal, 2012, p. 2551-2558, vol. 18(9).

Jian-Ming Jiang et al., "Crystalline Low-Band Gap Polymers Comprising Thiophene and 2,1,3-Benzooxadiazole Units for Bulk Heterojunction Solar Cells", Macromolecules, 2011, p. 9155-9163, vol. 44(23).

Thu Trang Do et al., "Effect of the Number of Thiophene Rings in Polymers with 2,1,3-Benzooxadiazole Core on the Photovoltaic Properties", Organic Electronics, 2013, p. 2673-2681, vol. 14(10).

Journal of Materials Chemistry, vol. 21, No. 46, pp. 18744-18752.

Chemical Reviews, American Chemical Society, US, vol. 109, pp. 897-1091.

Handbook of Advanced Electronic and Photonic Materials and Devices, vol. 8, pp. 1-102.

Chemical Reviews, vol. 109, No. 11, pp. 5868-5923.

* cited by examiner

COPOLYMER AND ORGANIC SOLAR CELL USING SAME

This application is a National Stage Entry of International Application No. PCT/KR2013/011334, filed Dec. 9, 2013, which claims priority to and benefit of Korean Application No. 10-2012-0143044 filed Dec. 10, 2012 in the Korean Intellectual Property Office, both of which are incorporated herein by reference.

FIELD OF THE INVENTION

The present specification relates to a copolymer and an organic solar cell including the same.

BACKGROUND OF THE INVENTION

An organic solar cell is a device that can directly convert solar energy into electric energy by applying a photovoltaic effect. A solar cell can be divided into an inorganic solar cell and an organic solar cell, depending on the materials forming a thin film. Typical solar cells are made through a p-n junction by doping crystalline silicon (Si), which is an inorganic semiconductor. Electrons and holes generated by light absorption diffuse to p-n junction points and move to an electrode accelerating by the electric field. The power conversion efficiency in this process is defined as the ratio of electric power given to external circuit and solar power entering the solar cell, and the efficiency have reached approximately 24% when measured under a currently standardized hypothetical solar irradiation condition. However, existing inorganic solar cells already have shown the limit in economic feasibility and material demands and supplies, therefore, an organic semiconductor solar cell have come into the spotlight as a long-term alternative energy source due to easy fabrication, a low cost, and various functionality.

For the solar cell, it is important to increase efficiency so as to output as much electric energy as possible from solar energy. In order to increase the efficiency of this solar cell, generating as many exitons as possible inside a semiconductor is important, however, it is also important to pull the generated charges to the outside without loss. One of the reasons for the charge loss is the dissipation of generated electrons and holes due to recombination. Various methods have been proposed to deliver generated electrons and holes to an electrode without loss, however, additional processes are required in most cases and therefore, manufacturing costs can increase.

PRIOR ART DOCUMENTS

Patent Document

U.S. Pat. No. 5,331,183
U.S. Pat. No. 5,454,880

Non-Patent Document

Two-layer organic photovoltaic cell (C. W. Tang, Appl. Phys. Lett., 48, 183. (1996))
Efficiencies via Network of Internal Donor-Acceptor Heterojunctions (G. Yu, J. Gao, J. C. Hummelen, F. Wudl, A. J. Heeger, Science, 270, 1789. (1995))

SUMMARY OF THE INVENTION

An objective of the present specification is to provide a copolymer having excellent electrical properties and excellent photoelectric transformation efficiency, and an organic solar cell including the same.

In one embodiment of the present specification, a copolymer including an A unit represented by any one of the following Chemical Formulae 1 to 3; a B unit represented by the following Chemical Formula 4; and a C unit represented by the following Chemical Formula 5 is provided.

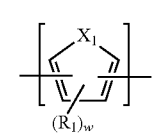

[Chemical Formula 1]

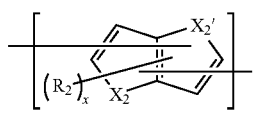

[Chemical Formula 2]

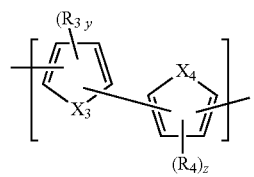

[Chemical Formula 3]

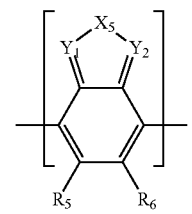

[Chemical Formula 4]

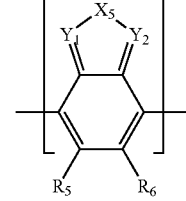

[Chemical Formula 5]

In Chemical Formulae 1 to 5, w, x, y and z are each an integer of 0 to 2, $X_1$ to $X_6$ and $X_2'$ are the same as or different from each other, and each independently selected from the group consisting of CRR', NR, O, SiRR', PR, S, GeRR', Se and Te, $Y_1$ to $Y_3$ are the same as or different from each other, and each independently selected from the group consisting of CR, N, SiR, P and GeR, R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring, $R_1$ to $R_4$ and $R_7$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring, $R_5$ is selected from the group consisting of hydrogen; deuterium; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, and $R_6$ is selected from the group consisting of deuterium; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

In addition, the present specification provides an organic solar cell including a first electrode; a second electrode provided opposite to the first electrode; and one or more layers of organic material layers including a photoactive layer, which are provided between the first electrode and the second electrode, wherein one or more layers of the organic material layers include the copolymer.

Advantageous Effects

A copolymer of the present specification may be used as the material of an organic material layer of an organic solar cell, and the organic solar cell using the copolymer can show excellent characteristics in an open circuit voltage increase, an efficiency increase, and the like. Particularly, the copolymer according to one embodiment of the present specification can have excellent characteristics since the copolymer has a deep HOMO level, a small bandgap, and high charge mobility. The copolymer according to one embodiment of the present specification may be used either alone or as a mixture with other materials in an organic solar cell, and can improve efficiency and life span characteristics of a device due to the thermal stability of the compound.

DETAILED DESCRIPTION OF THE EMBODIMENTS

Figure 1:
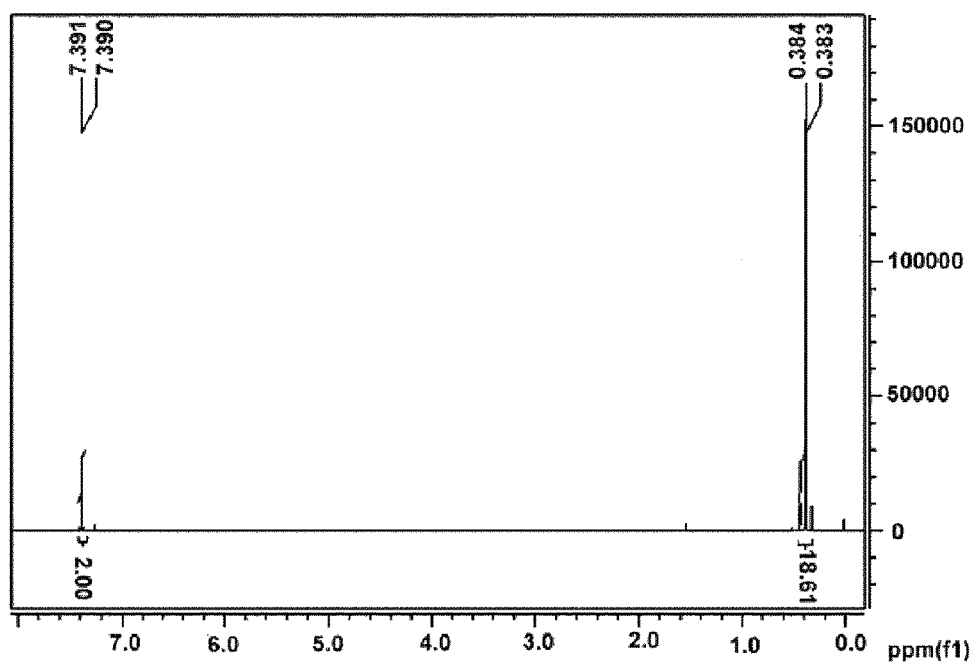
FIG. 1 is a diagram showing an NMR spectrum of a compound by Example 1.

Hereinafter, the present specification will be described in detail.

In the present specification, the copolymer provides a copolymer that includes the A unit, the B unit and the C unit.

In the present specification, a 'unit' is a repeating structure included in a monomer of a copolymer, and means a structure in which a monomer is bonded within a polymer by polymerization.

In one embodiment of the present specification, the A unit is any one of Chemical Formulae 1 to 3. The A unit includes a monocyclic or multicyclic aromatic, or a monocyclic or multicyclic heteroaromatic ring group. When the A unit is included, effects such as a conjugation length increase, a bandgap decrease, and a charge mobility increase can be provided.

In one embodiment of the present specification, the B unit is Chemical Formula 4. Chemical Formula 4 includes a multicyclic aromatic or a multicyclic heteroaromatic ring group. When the B unit is included, an electron-attracting effect is shown resulting in a bandgap decrease.

In one embodiment of the present specification, solubility may increase by introducing a substituent to the B unit. For example, when an alkyl group is introduced to the B unit, solubility increases.

In one embodiment of the present specification, a halogen group is not introduced to the B unit. In the related art, attempts to lower the energy level of a copolymer and change morphology when coating have been made by introducing a halogen group, however, when a halogen group is included, a solution process is unfavorable due to a solubility decrease. For a copolymer that includes the B unit according to one embodiment of the present specification, a proper energy level and excellent morphology can be obtained even when a halogen group is not introduced. In addition, solubility is excellent and thereby solution process is favorable, since a halogen group is not introduced.

In one embodiment of the present specification, the C unit is Chemical Formula 5. Chemical Formula 5 may include a multicyclic aromatic or aliphatic heterocyclic imide group. When the C unit is included, a bandgap may decrease since the imide ring part included in the C unit has an electron-attraction ability.

In one embodiment of the present specification, solubility may increase by introducing a substituent to the C unit. For example, when an alkyl group is introduced to the C unit, solubility increases.

In one embodiment of the present specification, a copolymer that includes the A unit, the B unit and the C unit has a low bandgap and excellent charge mobility, since the A unit having an electron-donating effect and the B or C unit having an electron-attracting effect are repeatedly present.

In one embodiment of the present specification, $X_1$ to $X_4$, $X_6$ and $X_2'$ are the same as or different from each other, and each independently S, O or Se.

In another embodiment, $X_1$ is S.
In another embodiment, $X_2$ is S.
In another embodiment, $X_2'$ is S.
In another embodiment, $X_3$ is S.
In another embodiment, $X_4$ is S.

In one embodiment of the present invention, the A unit represented by Chemical Formulae 1 to 3 is represented by the following Chemical Formula 11, 21 or 31.

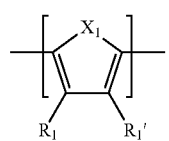

[Chemical Formula 11]

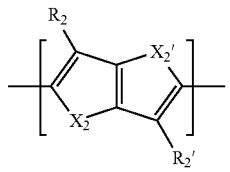

[Chemical Formula 21]

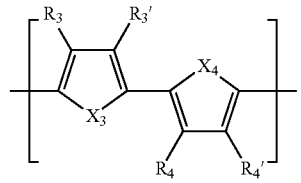

[Chemical Formula 31]

In Chemical Formulae 11, 21 and 31, $X_1$ to $X_4$, $X_2'$, and $R_1$ to $R_4$ are the same as those defined in Chemical Formulae 1 to 3, $R_1'$ has the same definition as $R_1$, $R_2'$ has the same definition as $R_2$, $R_3'$ has the same definition as $R_3$, and $R_4'$ has the same definition as $R_4$.

In another embodiment, $X_6$ is S.
In another embodiment, $X_5$ is NR. In this case, R is as defined above.
In another embodiment, $X_5$ is S.
In another embodiment, $Y_1$ is N.
In another embodiment, $Y_2$ is N.

In one embodiment of the present specification, $X_5$ is NR or S, $Y_1$ and $Y_2$ are N, and R is as defined above.

In one embodiment of the present invention, $R_5$ and $R_6$ are the same as or different from each other, and each independently a hydroxy group, or a substituted or unsubstituted alkoxy group.

In one embodiment of the present invention, $X_5$ is NR or S, $Y_1$ and $Y_2$ are N, R is as defined above. $R_5$ and $R_6$ are the same as or different from each other, and each independently a hydroxy group, or a substituted or unsubstituted alkoxy group.

In another embodiment, $R_5$ and $R_6$ are the same as or different from each other, and each independently a hydroxy group, or a substituted or unsubstituted linear or branched alkoxy group having 1 to 20 carbon atoms.

In one embodiment of the present specification, at least one of $R_5$ and $R_6$ is not hydrogen, therefore, there is an advantage in that solubility suitable for an element constitution can be obtained.

In another embodiment, $X_6$ is S, O or Se, $Y_3$ is N, and $R_7$ is hydrogen, or a substituted or unsubstituted alkyl group.

In another embodiment, $R_7$ is hydrogen, or a substituted or unsubstituted linear or branched alkyl group having 1 to 20 carbon atoms.

In one embodiment of the present specification, a copolymer further including a D unit that includes one, two or more selected from the group consisting of a substituted or unsubstituted aryl group and a substituted or unsubstituted heteroring group having 3 to 30 ring member carbon atoms, is provided.

In the present specification, the number of ring member carbon atoms means the number of carbon atoms forming an aliphatic or aromatic ring, and, when the aliphatic or aromatic ring is substituted, includes the number of ring member carbon atoms of the substituent.

When the number of ring member carbon atoms is 30 or less, monomer synthesis is advantageous, therefore, it is effective in reducing the process steps and lowering the unit price of materials. In addition, as the number of ring member carbon atoms increases, an electron donation ability within the polymer increases, thereby the HOMO energy level increases, and as a result, a low open circuit voltage can be obtained when preparing a device. When the number of ring member carbon atoms is 30 or less, there is an advantage in that a proper electron donation ability can be achieved within the polymer thereby proper HOMO energy level can be achieved.

In one embodiment of the present specification, a copolymer, in which the D unit further includes one, two or more of the following chemical formulae, is provided.

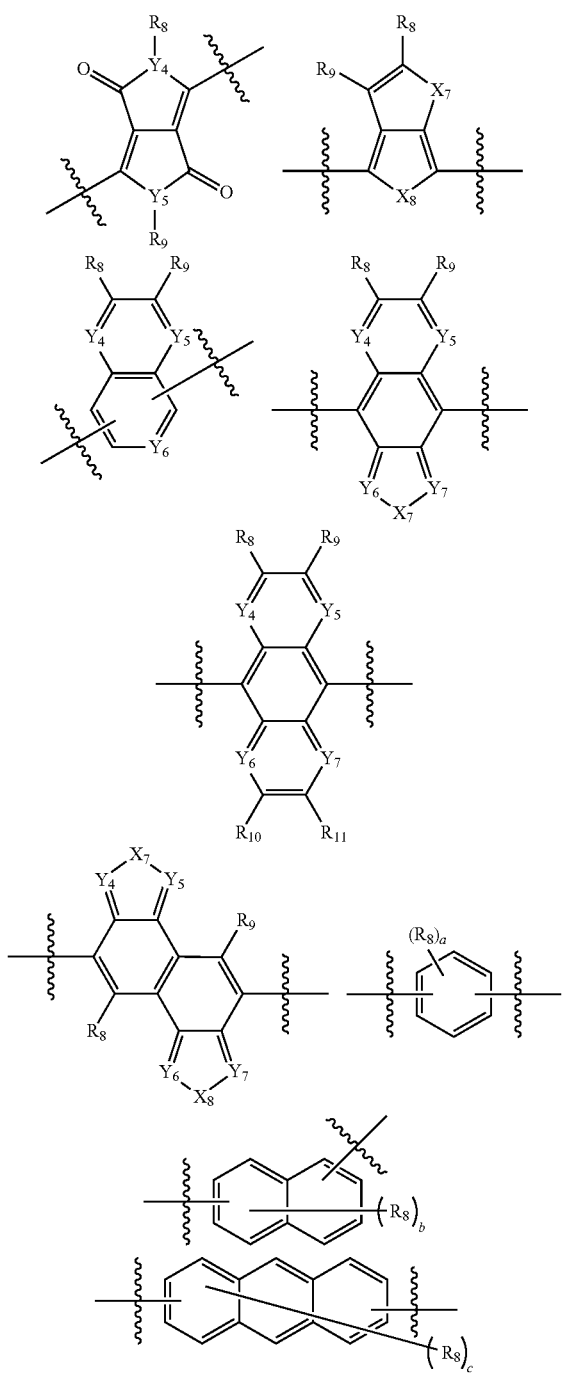

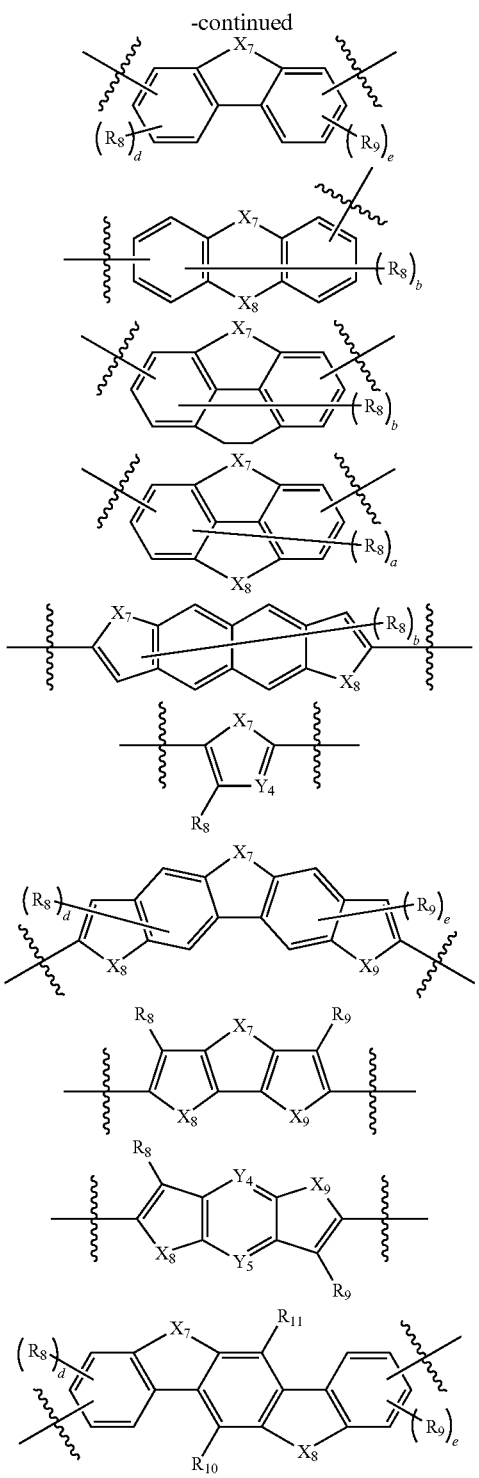

a is an integer of 0 to 4,
b is an integer of 0 to 6,
c is an integer of 0 to 8,
d and e are each an integer of 0 to 3,
$R_8$ to $R_{11}$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring, $X_7$ to $X_9$ are the same as or different from each other, and each independently selected from the group consisting of CRR', NR, O, SiRR', PR, S, GeRR', Se and Te, $Y_4$ to $Y_7$ are the same as or different from each other, and each independently selected from the group consisting of CR, N, SiR, P and GeR, and R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

In one embodiment of the present specification, the chemical formulae shown above are a substituted or unsubstituted aryl group or a substituted or unsubstituted heteroring group having 3 to 30 ring member carbon atoms.

Additional substituents may be introduced so that the sum of the number of ring member carbon atoms of the above chemical formulae and the number of ring member carbon atoms of the substituent of the above chemical formulae becomes 30 or less.

For example,

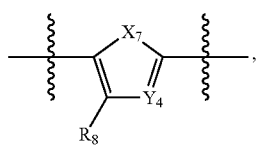

which has a maximum of 5 ring member carbon atoms;

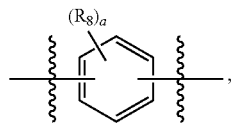

which has 6 ring member carbon atoms;

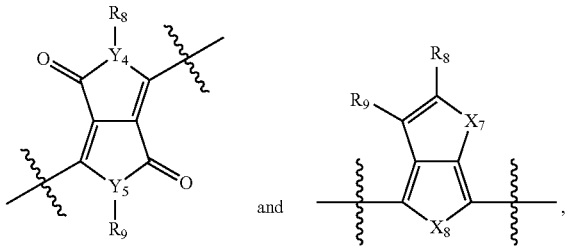

which have a maximum of 8 ring member carbon atoms; or

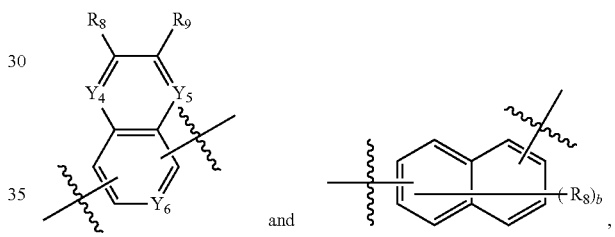

which have a maximum of 10 ring member carbon atoms, may be substituted with an aryl group such as a phenyl group, a biphenyl group, a terphenyl group, a stilbene group, a naphthyl group, an anthracenyl group, a phenanthrenyl group, a pyrenyl group, a perylenyl group, a tetracenyl group, a crycenyl group, a fluorenyl group, an acenaphthacenyl group, a triphenylene group or a fluoranthene group, and may be substituted with a heteroring group such as a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group or a dibenzofuranyl group, but the substituents are not limited thereto.

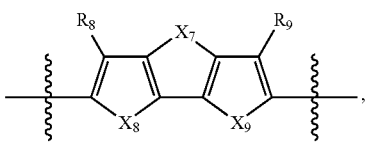

which has a maximum of 11 ring member carbon atoms; or

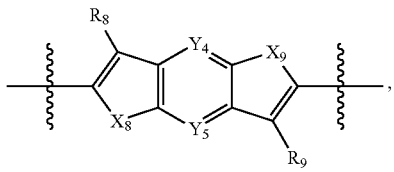

which has a maximum of 12 ring member carbon atoms, may be substituted with an aryl group such as a phenyl group, a biphenyl group, a terphenyl group, a stilbene group, a naphthyl group, an anthracenyl group, a phenanthrenyl group, a pyrenyl group, a tetracenyl group, a crycenyl group, a fluorenyl group, an acenaphthacenyl group, a triphenylene group or a fluoranthene group, and may be substituted with a heteroring group such as a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group or a dibenzofuranyl group, but the substituents are not limited thereto.

As another example,

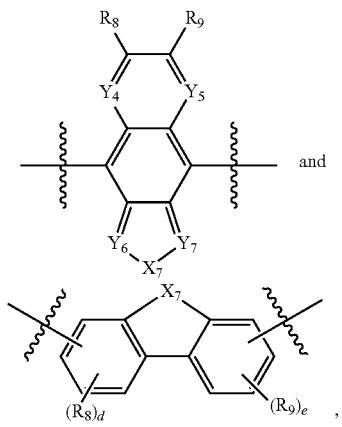

which have a maximum of 13 ring member carbon atoms; or

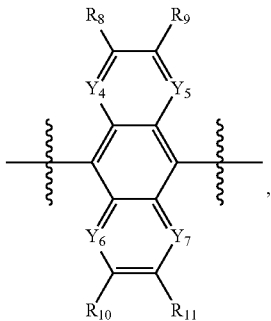

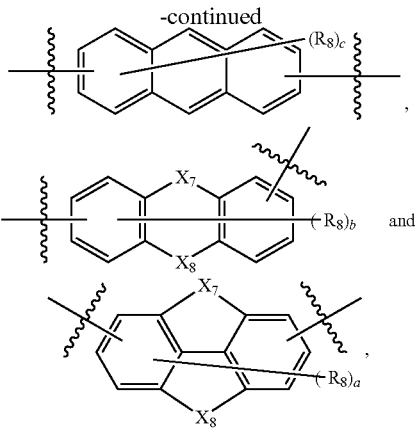

which have a maximum of 14 ring member carbon atoms, may be substituted with an aryl group such as a phenyl group, a biphenyl group, a stilbene group, a naphthyl group, an anthracenyl group, a phenanthrenyl group, a pyrenyl group, a fluorenyl group, an acenaphthacenyl group or a fluoranthene group, and may be substituted with a heteroring group such as a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group or a dibenzofuranyl group, but the substituents are not limited thereto.

As another example,

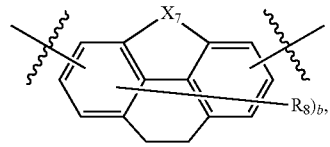

which has a maximum of 15 ring member carbon atoms; or

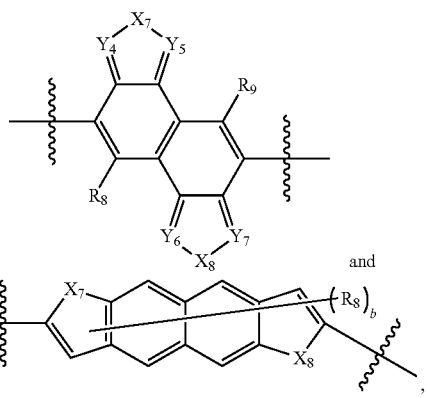

which have a maximum of 16 ring member carbon atoms, may be substituted with an aryl group such as a phenyl group, a biphenyl group, a stilbene group, a naphthyl group, an anthracenyl group, a phenanthrenyl group, a fluorenyl group or an acenaphthacenyl group, and may be substituted with a heteroring group such as a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzimidazole group, a benzothiazole group, a benzothiophene group, a dibenzothiophene group, a benzofuranyl group, a phenanthroline group or a dibenzofuranyl group, but the substituents are not limited thereto.

As another example,

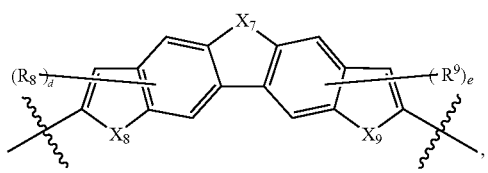

which has a maximum of 19 ring member carbon atoms; or

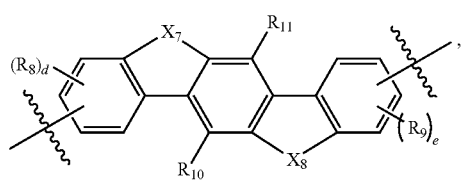

which has a maximum of 20 ring member carbon atoms, may be substituted with an aryl group such as a phenyl group or a naphthyl group, and may be substituted with a heteroring group such as a thiophene group, a furan group, a pyrrole group, an imidazole group, a thiazole group, an oxazole group, an oxadiazole group, a triazole group, a pyridyl group, a bipyridyl group, a triazine group, a pyridazine group, a qinolinyl group, an isoquinoline group, an indole group, a benzoxazole group, a benzimidazole group, a benzothiazole group, a benzothiophene group or a benzofuranyl group, but the substituents are not limited thereto.

The copolymer further including the D unit that includes one, two or more of the chemical Formulae shown above can decrease a bandgap, or increase solubility.

Examples of the substituent will be described below, but the substituents are not limited thereto.

In the present specification, the alkyl group may be linear or branched, and although not particularly limited, the number of carbon atoms is preferably 1 to 20. Specific examples thereof include a methyl group, an ethyl group, a propyl group, an isopropyl group, a butyl group, a t-butyl group, a pentyl group, a hexyl group, a heptyl group and the like, but are not limited thereto.

In the present specification, the alkenyl group may be linear or branched, and although not particularly limited, the number of carbon atoms is preferably 2 to 40. Specific examples thereof preferably include an alkenyl group in which an aryl group such as a stylbenzyl group or a styrenyl group is substituted, but are not limited thereto.

In the present specification, the alkoxy group may be linear, branched or cyclic, and although not particularly limited, the number of carbon atoms is preferably 1 to 20.

Specific examples thereof include a methoxy group, an ethoxy group, an n-propyloxy group, an iso-propyloxy group, an n-butyloxy group, a cyclopentyloxy group and the like, but are not limited thereto.

In the present specification, the cycloalkyl group is not particularly limited, however, the number of carbon atoms is preferably 3 to 60, and particularly, a cyclopentyl group or a cyclohexyl group is preferable.

In the present specification, the halogen group may include fluorine, chlorine, bromine or iodine.

In the present specification, the aryl group may be monocyclic, and although not particularly limited, the number of carbon atoms is preferably 6 to 60. Specific examples of the aryl group include a monocyclic aromatic group such as a phenyl group, a biphenyl group, a triphenyl group or a terphenyl group, and a multicyclic aromatic group such as a naphthyl group, an anthracenyl group, a phenanthrenyl group, a pyrenyl group, a perylenyl group, a tetracenyl group, a crycenyl group, a fluorenyl group, an acenaphthacenyl group, a triphenylene group or a fluoranthene group, but are not limited thereto.

In the present specification, the heteroring group is a heteroring group that includes O, N or S as a heteroatom, and although not particularly limited, the number of carbon atoms is preferably 2 to 60. Examples of the heteroring group include a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a dibenzofuranyl group and the like, but are not limited thereto.

In the present specification, the number of carbon atoms of the imide group is not particularly limited, but is preferably 1 to 25. Specific examples thereof include the compound having the following structures, but are not limited thereto.

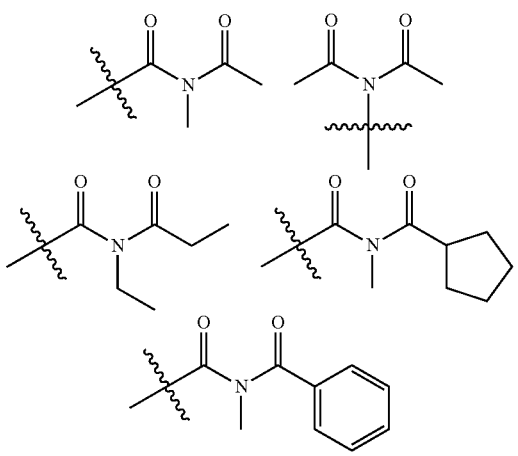

In the present specification, in the amide group, the nitrogen of the amide group may be once or twice substituted with hydrogen, a linear, branched or cyclic alkyl group having 1 to 25 carbon atoms, or an aryl group having 6 to 25 carbon atoms. Specific examples thereof include the compound having the following structures, but are not limited thereto.

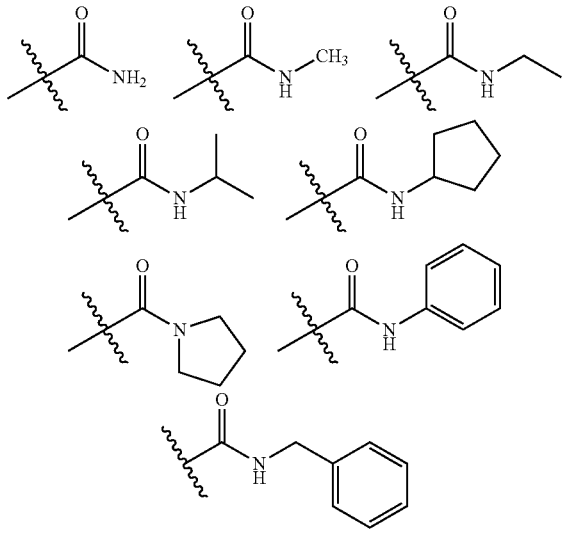

In the present specification, in the ester group, the oxygen of the ester group may be substituted with a linear, branched or cyclic alkyl group having 1 to 25 carbon atoms, or an aryl group having 6 to 25 carbon atoms. Specific examples thereof include the compound having the following structures, but are not limited thereto.

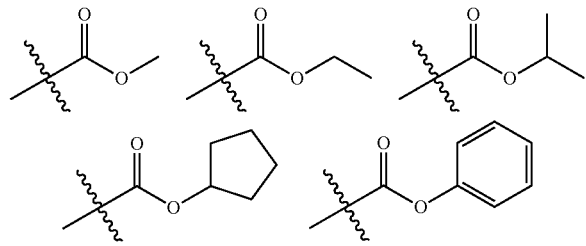

The heteroaryl group in the present specification may be selected from among the examples of the heteroring group described above.

In the present specification, the fluorenyl group has a structure in which two cyclic organic compounds are linked through one atom, and examples thereof include

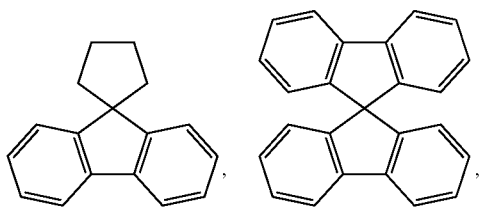

or the like.

In the present specification, the fluorenyl group includes the structure of an open fluorenyl group, and herein, the open fluorenyl group has a structure in which the linkage of one ring compound is broken in the structure of two ring compounds linked through one atom, and examples thereof include

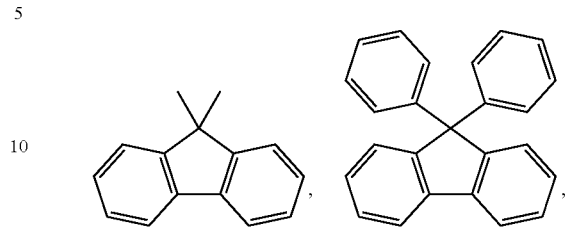

or the like.

In the present specification, the number of carbon atoms of the amine group is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group or the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group, or a multicyclic aryl group. The arylamine group including two or more aryl groups may include a monocyclic aryl group, a multicyclic aryl group, or a monocyclic aryl group and a multicyclic aryl group at the same time.

In the present specification, the aryl group in the aryloxy group, the arylthioxy group, the arylsulfoxide group and the aralkylamine group is the same as the examples of the aryl group described above.

In the present specification, the alkyl group in the alkylthioxy group, the alkylsulfoxide group, the alkylamine group and the aralkylamine group is the same as the examples of the alkyl group described above.

In the present specification, the heteroaryl group in a heteroarylamine group may be selected from among the examples of the heteroring group described above.

In addition, in the present specification, the term "substituted or unsubstituted" means being substituted with one or more substituents selected from the group consisting of deuterium; a halogen group; an alkyl group; an alkenyl group; an alkoxy group; a cycloalkyl group; a silyl group; an arylalkenyl group; an aryl group; an aryloxy group; an alkylthioxy group; an alkylsulfoxide group; an arylsulfoxide group; a boron group; an alkylamine group; an aralkylamine group; an arylamine group; a heteroaryl group; a carbazole group; an arylamine group; an aryl group; a fluorenyl group; a nitrile group; a nitro group; a hydroxy group and a heteroring group including one or more of N, O and S atoms, or having no substituents.

In the present specification, the two adjacent substituents mean substituents that substitute neighboring carbons.

In the present specification, the two adjacent substituents being bonded to each other to form a hydrocarbon ring or a heteroring means that each of the adjacent substituents is bonded to each other to form a 5-membered to 8-membered hydrocarbon ring or heteroring.

The hydrocarbon ring may be an aliphatic ring, an aromatic ring, or a fused ring of an aliphatic ring and an aromatic ring, and may be monocyclic or multicyclic.

The heteroring is a ring that includes one or more of N, O and S, and may be an aliphatic ring, an aromatic ring, or a fused ring of an aliphatic ring and an aromatic ring, and may be monocyclic or multicyclic.

In one embodiment of the present specification, the copolymer is selected from the group consisting of a random copolymer, an alternative copolymer, a block copolymer, a graft copolymer and a starblock copolymer.

In another embodiment, the copolymer is an alternative copolymer.

In another embodiment, the copolymer is a random copolymer. When the copolymer is a random copolymer, there is an economic advantage in terms of time and/or cost since heat treatment or aging is not mandatory in the process due to the noncrystalline properties.

In one embodiment of the present specification, the copolymer includes a structure represented by the following Chemical Formula 6.

[Chemical Formula 6]

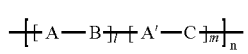

In Chemical Formula 6, l is a molar fraction and a real number of $0<l<1$, m is a molar fraction and a real number of $0<m<1$, and $l+m=1$, n is an integer of 1 to 10,000, A and A' are the same as or different from each other, and each independently any one of Chemical Formulae 1 to 3, B is Chemical Formula 4, and C is Chemical Formula 5.

In another embodiment, the copolymer includes a structure represented by the following Chemical Formula 7.

[Chemical Formula 7]

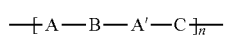

In Chemical Formula 7, n is an integer of 1 to 10,000,

A and A' are the same as or different from each other, and each independently any one of Chemical Formulae 1 to 3, B is Chemical Formula 4, and C is Chemical Formula 5.

In another embodiment, the copolymer further includes the D unit in addition to the A unit, the B unit and the C unit. The copolymer includes a structure represented by the following Chemical Formula 8.

[Chemical Formula 8]

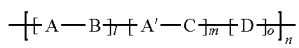

In Chemical Formula 8, l is a molar fraction and a real number of $0<l<1$, m is a molar fraction and a real number of $0<m<1$, o is a molar fraction and a real number of $0\leq o<1$, and $l+m+o=1$, n is an integer of 1 to 10,000, A and A' are the same as or different from each other, and each independently any one of Chemical Formulae 1 to 3, B is Chemical Formula 4, C is Chemical Formula 5, D includes one, two or more of the following Chemical Formulae,

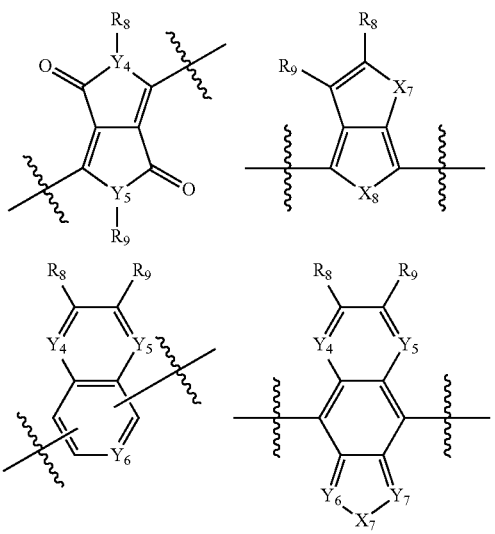

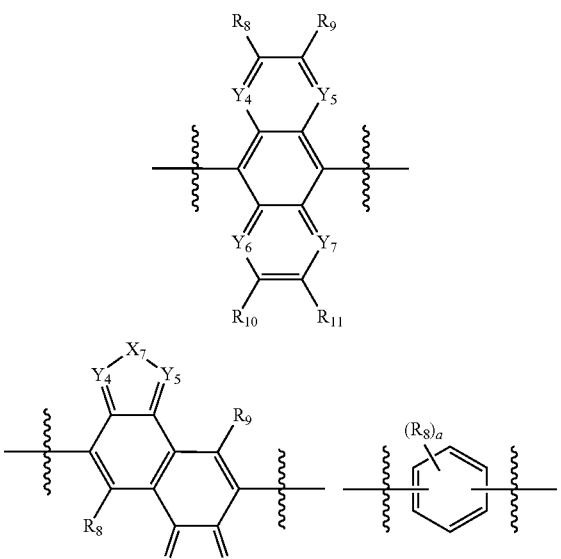

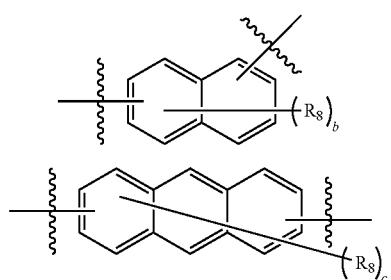

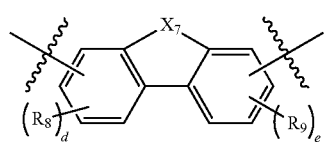

-continued

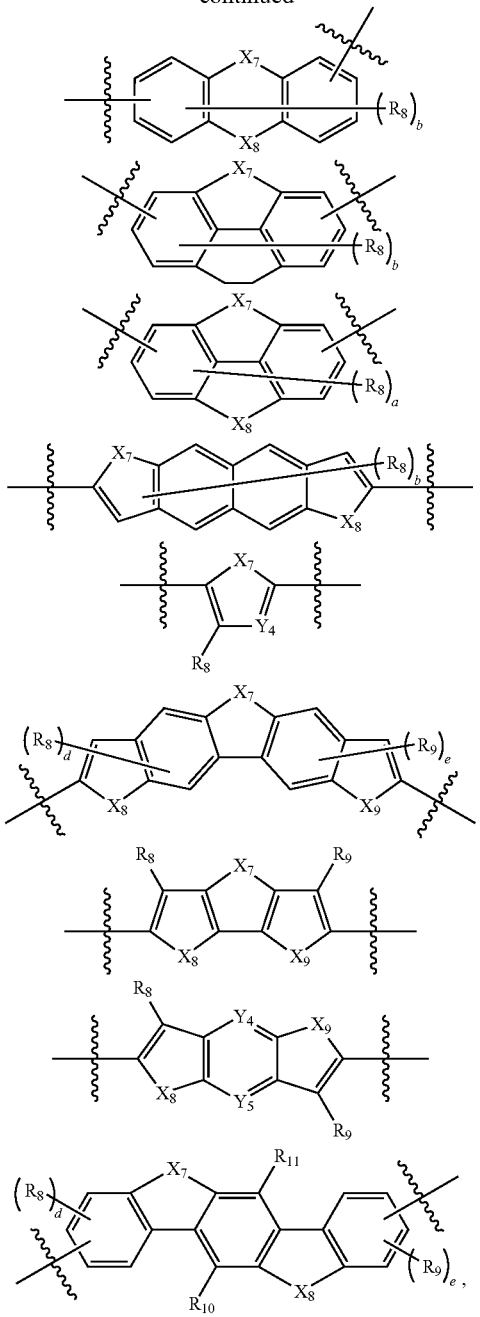

and a, b, c, d, e, $R_8$ to $R_{11}$, $X_7$ to $X_9$, and $Y_4$ to $Y_7$ are the same as those defined above.

In one embodiment of the present specification, the content of the A unit is greater than or equal to 50 mol % and less than 100 mol % with respect to the total content of the copolymer, the content of the B+C units is greater than 0 mol % and less than or equal to 50 mol % with respect to the total content of the copolymer, and the ratio of the B unit with respect to the C unit is greater than 0.01 and less than or equal to 1.

In one embodiment of the present specification, the end group of the copolymer is selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

In one embodiment of the present specification, the end group of the copolymer is a heteroring group or an aryl group.

In one embodiment of the present specification, the end group of the copolymer is a 4-(trifluoromethyl)phenyl group.

According to one embodiment of the present specification, the number-average molecular weight of the copolymer preferably ranges from 500 to 1,000,000 g/mol. The number-average molecular weight of the copolymer more preferably ranges from 10,000 to 100,000. In one embodiment of the present specification, the number-average molecular weight of the copolymer ranges from 30,000 to 70,000.

According to one embodiment of the present specification, the copolymer may have a molecular weight distribution ranging from 1 to 100. Preferably, the copolymer has a molecular weight distribution ranging from 1 to 3.

Electrical properties and mechanical properties become better as the molecular weight distribution is lower, and the number-average molecular weight is higher.

In addition, the number-average molecular weight is preferably 100,000 or less so as to secure solubility higher than a certain level thereby to have an advantage in applying a solution coating method.

The copolymer may be prepared based on the preparation examples described later.

The copolymer according to the present specification may be prepared using a multistep chemical reaction. After monomers are synthesized through an alkylation reaction, a Grignard reaction, a Suzuki coupling reaction, a Stille coupling reaction, and the like, and final copolymers may be synthesized through a carbon-carbon coupling reaction such as a Stille coupling reaction. When the substituent to be introduced is a boronic acid or boronic ester compound, a Suzuki coupling reaction may be used, and when the substituent to be introduced is a tributyltin compound, a Stille coupling reaction may be used, however, the preparation method is not limited thereto.

In addition, the present specification provides an organic solar cell including the copolymer that includes the A unit, the B unit and the C unit.

In one embodiment of the present specification, an organic solar cell including a first electrode; a second electrode provided opposite to the first electrode; and one or more layers of organic material layers including a photoactive layer, which are provided between the first electrode and the second electrode, wherein one or more layers of the organic material layers include the copolymer that includes the A unit, the B unit and the C unit.

An organic solar cell according to one example of the present specification includes a first electrode, a photoactive layer and a second electrode. The organic solar cell may further include a substrate, a hole transfer layer and/or an electron transfer layer.

In one embodiment of the present specification, the organic material layer includes a hole transfer layer, a hole injection layer, or a layer that transfers and injects holes at the same time, and the hole transfer layer, the hole injection layer, or the layer that transfers and injects the holes at the same time includes the copolymer.

In another embodiment, the organic material layer includes an electron injection layer, an electron transfer layer, or a layer that injects and transfers electrons at the same time, and the electron injection layer, the electron transfer layer, or the layer that injects and transfers electrons at the same time includes the copolymer.

In one embodiment of the present specification, when the organic solar cell receives photons from an external light source, electrons and holes are generated between an electron donor and an electron acceptor. The generated holes are transferred to an anode through an electron donor layer.

In one embodiment of the present specification, the organic solar cell may further include additional organic material layers. The organic solar cell may reduce the number of organic material layers by using organic materials simultaneously having a number of functions.

In one embodiment of the present specification, the organic solar cell may be arranged in order of a cathode, a photoactive layer and an anode, or in order of an anode, a photoactive layer and a cathode, but the arrangement is not limited thereto.

In another embodiment, the organic solar cell may be arranged in order of an anode, a hole transfer layer, a photoactive layer, an electron transfer layer and a cathode, or in order of a cathode, an electron transfer layer, a photoactive layer, a hole transfer layer and an anode, but the arrangement is not limited thereto.

In another embodiment, a buffer layer may be provided between a photoactive layer and a hole transfer layer, or between a photoactive layer and an electron transfer layer. At this time, a hole injection layer may be further provided between an anode and the hole transfer layer. In addition, an electron injection layer may be further provided between a cathode and the electron transfer layer.

The substrate may include a glass substrate or a transparent plastic substrate, which has excellent transparency, surface smoothness, handling easiness and water resistance, but is not limited thereto, and substrates typically used for an organic solar cell may be used without limit. Specific examples thereof include glass, polyethylene terphthalate (PET), polyethylene naphthalate (PEN), polypropylene (PP), polyimide (PI), triacetyl cellulose (TAC) or the like, but are not limited thereto.

In one embodiment of the present specification, the first electrode is an anode, and the second electrode is a cathode. In another embodiment, the first electrode is a cathode, and the second electrode is an anode.

As the anode, a material having large work function is normally preferable so that hole injection to the organic material layer is smooth. In addition, a material that is transparent and has excellent conductivity may be included, but is not limited thereto. Specific examples of the anode material that can be used in the present specification include metals such as vanadium, chromium, copper, zinc or gold, or alloys thereof; metal oxides such as zinc oxides, indium oxides, indium tin oxides (ITO), tin oxide ($SnO_2$), zinc oxide (ZnO), or indium zinc oxides (IZO); and mixtures of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, or the like, but are not limited thereto.

As the cathode, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as Al/Li, $Al/BaF_2$, $Al/BaF_2/Ba$, LiF/Al or $LiO_2/Al$, or the like, but are not limited thereto.

The hole transfer layer and/or the electron transfer layer material may include a material that can efficiently transfer electrons and holes to a photoactive layer thereby increase the probability of moving generated charges to an electrode, but the material is not particularly limited.

The hole transfer layer material may include PEDOT:PSS (Poly(3,4-ethylenediocythiophene) doped with poly(styrenesulfonic acid)), molybdenum oxides ($MoO_x$); vanadium oxides ($V_2O_5$); nickel oxides (NiO); and tungsten oxides ($WO_x$), or the like, but is not limited thereto.

The electron transfer layer may include electron-extracting metal oxides, and may specifically include a metal complex of 8-hydroxyquinoline; a complex including $Alq_3$; a metal complex including Liq; LiF; Ca; titanium oxides ($TiO_x$); zinc oxides (ZnO); cesium carbonate ($Cs_2CO_3$), and the like, but is not limited thereto.

The hole injection material is preferably a material that can receive holes from an anode at a low voltage, and the highest occupied molecular orbital (HOMO) of the hole injection material is preferably between the work function of the anode and the HOMO of surrounding organic material layers. Specific examples of the hole injection material include a metal porphyrin, oligothiophene, an arylamine-based organic material, a hexanitrile hexaazatriphenylene-based organic material, a quinacridone-based organic material, a perylene-based organic material, anthraquinone, a polyaniline- and a polythiophene-based conductive polymer, and the like, but are not limited thereto.

In one embodiment of the present specification, the organic material layer is a photoactive layer, the photoactive layer includes one, two or more selected from the group consisting of an electron donor and an electron acceptor, and the electron donor material is the copolymer.

In one embodiment of the present specification, the electron acceptor material may include fullerene, a fullerene derivative, Basso Coupe, a semiconducting element, a semiconducting compound, and combinations thereof, and may specifically include phenyl $C_{61}$-butyric acid methyl ester ($PC_{61}BM$) or phenyl $C_{71}$-butyric acid methyl ester ($PC_{71}BM$).

In the photoactive layer, the electron donor material and the electron acceptor material may form a bulk heterojunction (BHJ). The electron donor material and the electron acceptor material are mixed in the ratio of 1:10 to 10:1 (w/w).

In one embodiment of the present specification, as a photoelectric transformation material of the photoactive layer, the copolymer including the first unit of Chemical Formula I and the electron acceptor are mixed in the weight ratio of 1:0.5 to 1:4.

At this time, when the fullerene derivative is mixed in the ratio of 0.5 or higher with respect to the copolymer including the A unit, the B unit and the C unit of the present specification, obstacle occurrences in the movement of generated electrons due to the insufficient content of the crystallized fullerene derivative can be prevented, and when the weight ratio of the fullerene derivative is 4 or less, the amount of the copolymer including the A unit, the B unit and the C unit, which absorbs light, is relatively proper, therefore, it has an advantage in that efficient absorption of light can be achieved.

In one embodiment of the present specification, the organic solar cell may be arranged in order of an anode electrode, a photoactive layer and a cathode electrode, or in order of a cathode electrode, a photoactive layer and an anode electrode but the arrangement is not limited thereto.

In another embodiment, the organic solar cell may be arranged in order of an anode electrode, a hole transfer layer, a photoactive layer, an electron transfer layer and a cathode electrode, or in order of a cathode electrode, an electron transfer layer, a photoactive layer, a hole transfer layer and an anode electrode, but the arrangement is not limited thereto.

The organic solar cell of the present specification may be prepared using materials and methods known in the related art except that the organic material layer includes the compound of the present specification, that is, the copolymer including the A unit, the B unit and the C unit.

Hereinafter, a method for preparing the copolymer including the A unit, the B unit and the C unit, and the manufacture of an organic solar cell using the same will be described in detail with reference to examples. However, the following examples are for illustrative purposes only, and the scope of the present specification is not limited thereto.

Example 1

Monomer Synthesis-1 (Synthesis of 2,5-bis(trimethylstannyl)thiophene)

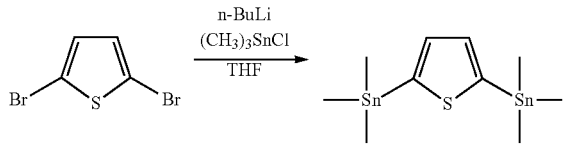

After 2,5-dibromothiophene (9.68 g, 40.0 mmol) was placed in tetrahydrofuran (200 ml) and dissolved therein, the temperature was lowered to −78° C. At this temperature, 1.6 M n-butyllithium (n-BuLi) dissolved in hexane (55 ml, 88 mmol) was slowly added thereto, and the mixture was stirred for 1 hour. After that, 1 M trimethyltinchloride dissolved in THF (100 ml, 100 mmol) was added at once thereto, the temperature was raised to room temperature, and the mixture was stirred for 12 hours. This solution was poured into ice, extracted three times with diethyl ether, then washed three times with water, and residual water was removed using magnesium sulfate (MgSO$_4$). The solution was recrystallized with methanol after the remaining solvent was removed under vacuum, and white solids were obtained.

Yield: 73.1%

FIG. 1 is a diagram showing an NMR spectrum of the compound by Example 1.

Example 2

Monomer Synthesis-2 (Synthesis of 2,5-bis-trimethylstannyl-thieno[3,2-b]thiophene)

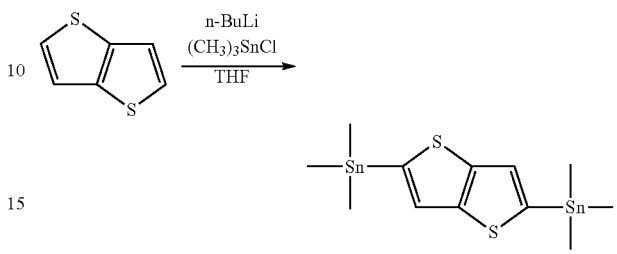

After thieno[3,2-b]thiophene (1.5 g, 10.7 mmol) was placed in tetrahydrofuran (50 ml) and dissolved therein, the temperature was lowered to −78° C. At this temperature, 1.6 M n-butyllithium (n-BuLi) dissolved in hexane (14.7 ml, 23.53 mmol) was slowly added thereto, and the mixture was stirred for 30 minutes. After that, the temperature was raised to 0° C., the mixture was stirred for 1 hour at that temperature, and the temperature was lowered again to −78° C. 1 M trimethyltinchloride dissolved in THF (26.7 ml, 26.7 mmol) was added at once thereto, the temperature was raised to room temperature, and the mixture was stirred for 12 hours. This solution was poured into ice, extracted three times with diethyl ether, then washed three times with water, and residual water was removed using magnesium sulfate (MgSO$_4$). The solution was recrystallized with methanol after the remaining solvent was removed under vacuum, and white solids were obtained.

Yield: 63.5%

Figure 2:
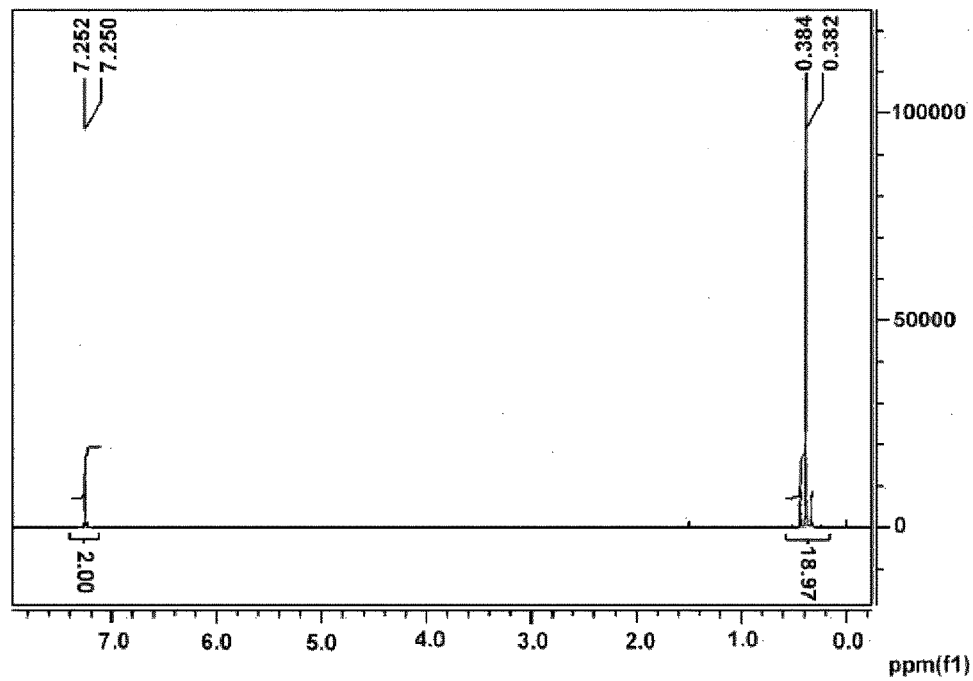
FIG. 2 is a diagram showing an NMR spectrum of a compound by Example 2.

FIG. 2 is a diagram showing an NMR spectrum of the compound by Example 2.

Example 3

Polymer Polymerization (Polymerization of Copolymer 1)

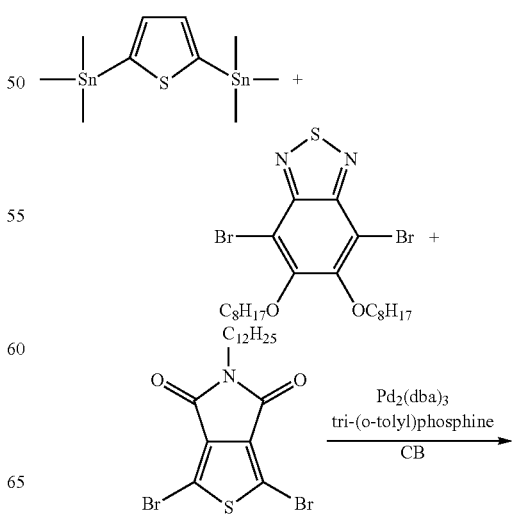

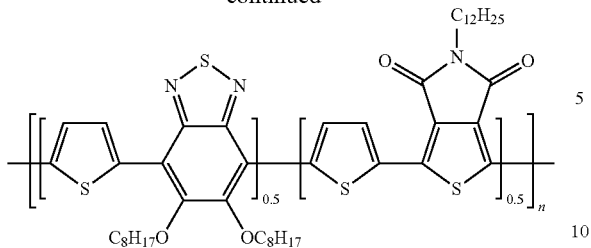

In the present specification, 4,7-dibromo-5,6-bis(octyloxy)benzo[c]-1,2,5-thiadiazole was prepared with reference to a previous literature (Wonho Lee, Hyosung Choi, Sungu Hwang, Jin Young Kim and Han Young Woo, Chem. Eur. J. 18, 2012, 2551-2558). In the present invention, 1,3-dibromo-5-dodecylthieno[3,4-c]pyrrole-4,6-dione was prepared with reference to a previous literature (Xugang Guo, Rocio Ponce Ortiz, Yan Zheng, Myung-Gil Kim, Shiming Zhang, Yan Hu, Gang Lu, Antonio Facchetti, and Tobin J. Marks, J. Am. Chem. Soc. 133, 2011, 13685-13697).

In a microwave reactor vial, chlorobenzene (15 ml), 2,5-bis(trimethylstannyl)thiophene (1.2 g, 2.93 mmol), 4,7-dibromo-5,6-bis(octyloxy)benzo[c]-1,2,5-thiadiazole (0.8059 g, 1.46 mmol), 1,3-dibromo-5-dodecylthieno[3,4-c]pyrrole-4,6-dione (0.7018 g, 1.46 mmol), tris(dibenzylideneacetone)dipalladium(0) ($Pd_2(dba)_3$, 80 mg) and tri-(o-tolyl)phosphine (107 mg) were placed, and the mixture was reacted for 1 hour at 170° C. After the mixture was cooled to room temperature and poured into methanol, the solid was filtered and then Soxhlet-extracted with acetone, hexane and chloroform. The chloroform portion was precipitated again in methanol, and the solid was filtered.

Yield: 44%

Number-average molecular weight: 43,100 g/mol

Weight-average molecular weight: 93,100 g/mol

Figure 3:
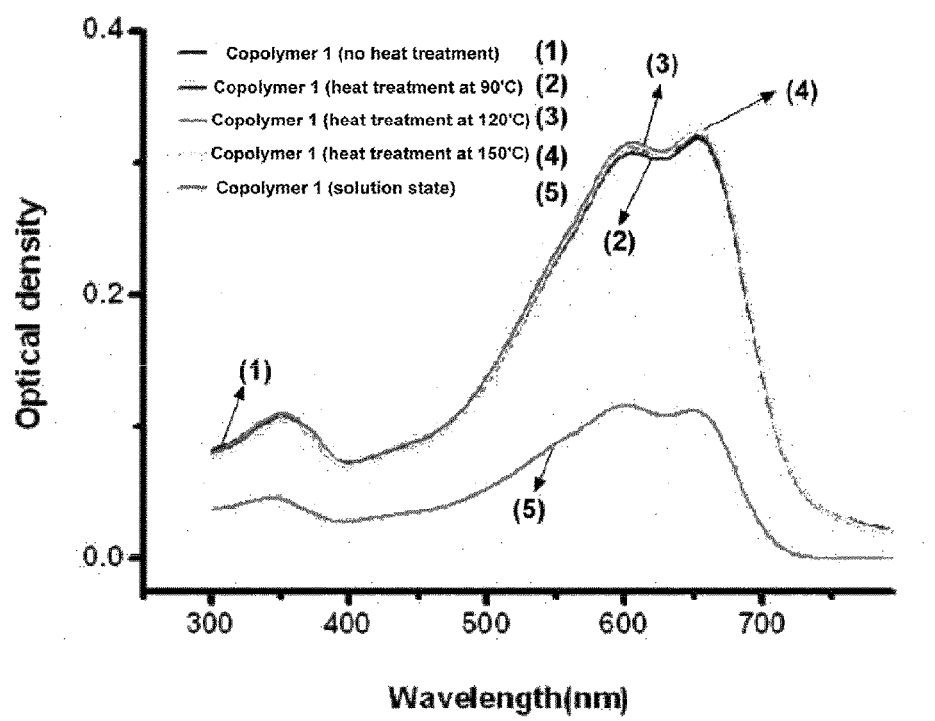
FIG. 3 is a diagram showing a film-phase UV-Vis absorption spectrum of Copolymer 1 by Example 3 heat-treated with a toluene solution.

FIG. 3 is a diagram showing a film-phase UV-Vis absorption spectrum of Copolymer 1 by Example 3 heat-treated with a toluene solution.

As the film-phase UV absorption spectrum of FIG. 3, the compound was dissolved in chlorobenzene in a concentration of 1 wt %, and after this solution was dropped on a glass substrate, the sample spin-coated at 1000 rpm for 60 seconds was heat-treated at 25° C., 90° C., 120° C. and 150° C., and then the sample was analyzed using a UV-Vis absorption spectrometer.

Figure 4:
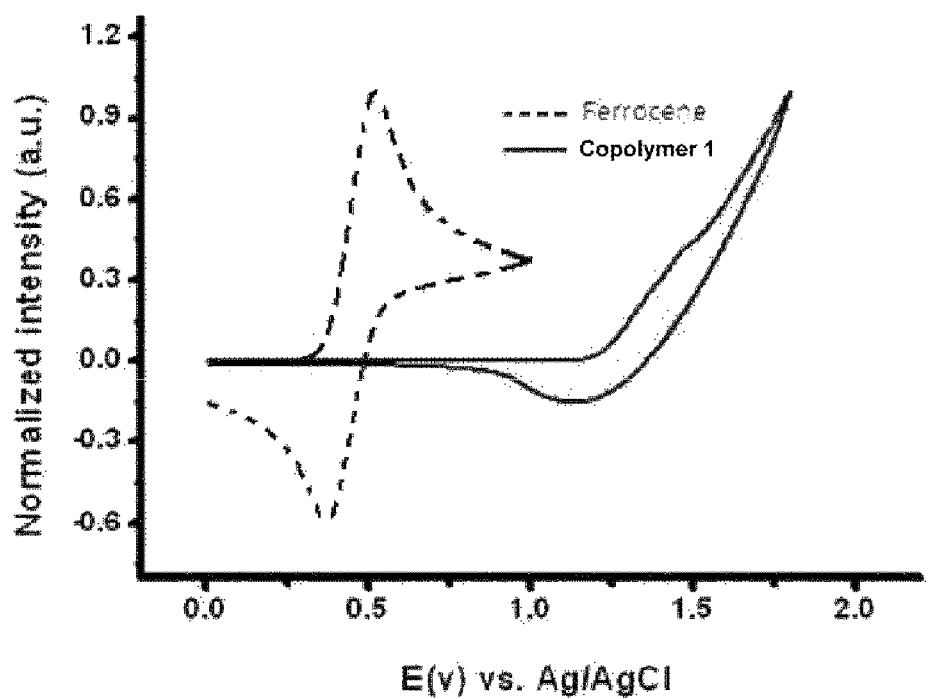
FIG. 4 is a diagram showing cyclic voltammetry of the compound by Example 3.

FIG. 4 is a diagram showing cyclic voltammetry of the compound by Example 3.

As the cyclic voltammetry measurement of FIG. 4, a three electrode method, in which a glassy carbon working electrode, an Ag/AgCl reference electrode and a Pt electrode were immersed in an electrolyte solution in which $Bu_4NBF_4$ was dissolved in acetonitrile in a concentration of 0.1 M, was used. The compound was coated on a working electrode using a drop casting method.

Example 4

Polymer Polymerization (Polymerization of Copolymer 2)

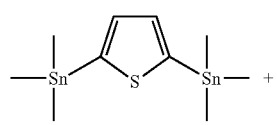

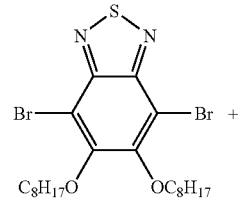

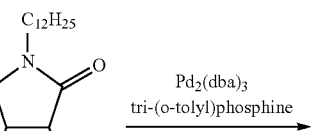

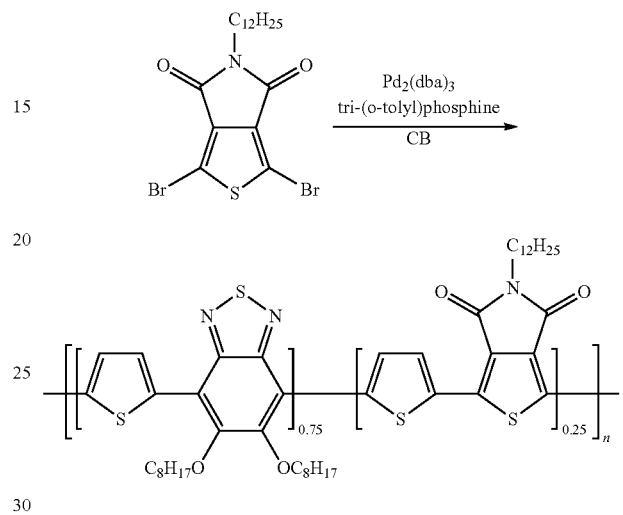

In a microwave reactor vial, chlorobenzene (15 ml), 2,5-bis(trimethylstannyl)thiophene (1.2 g, 2.93 mmol), 4,7-dibromo-5,6-bis(octyloxy)benzo[c]-1,2,5-thiadiazole (1.2089 g, 2.20 mmol), 1,3-dibromo-5-dodecylthieno[3,4-c]pyrrole-4,6-dione (0.3509 g, 0.73 mmol), tris(dibenzylideneacetone)dipalladium(0) ($Pd_2(dba)_3$, 80 mg) and tri-(o-tolyl)phosphine (107 mg) were placed, and the mixture was reacted for 1 hour at 170° C. After the mixture was cooled to room temperature and poured into methanol, the solid was filtered and then Soxhlet-extracted with acetone, hexane and chloroform. The chloroform portion was precipitated again in methanol, and the solid was filtered.

Yield: 52%

Number-average molecular weight: 26,400 g/mol

Weight-average molecular weight: 73,900 g/mol

Figure 5:
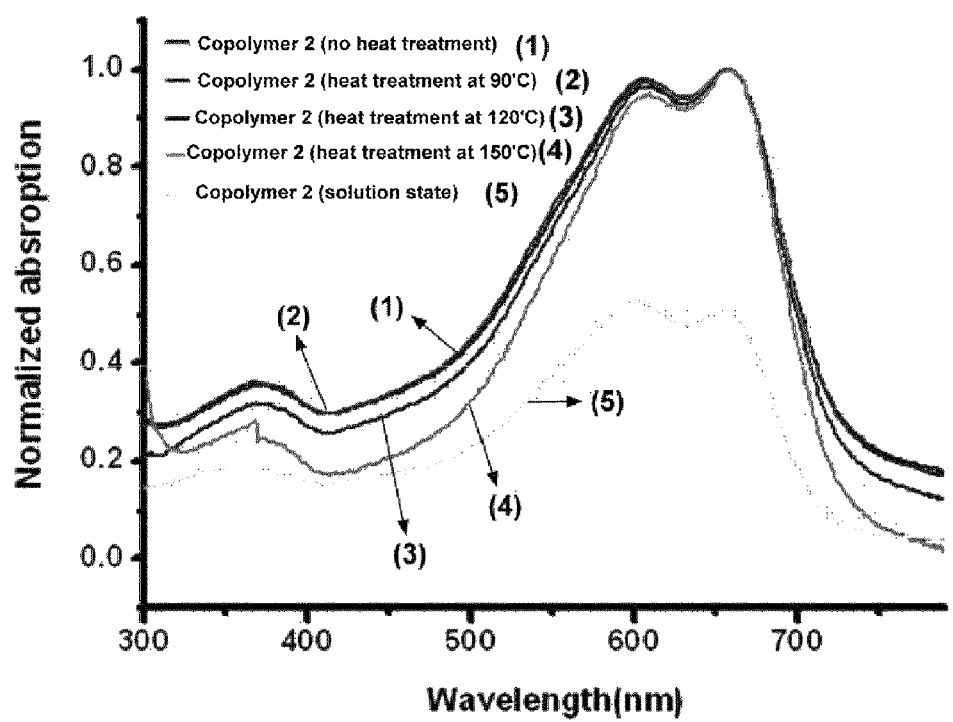
FIG. 5 is a diagram showing a film-phase UV-Vis absorption spectrum of Copolymer 2 by Example 4 heat-treated with a toluene solution.

FIG. 5 is a diagram showing a film-phase UV-Vis absorption spectrum of Copolymer 2 by Example 4 heat-treated with a toluene solution.

As the film-phase UV absorption spectrum of FIG. 5, the compound was dissolved in chlorobenzene in a concentration of 1 wt %, and after this solution was dropped on a glass substrate, the sample spin-coated at 1000 rpm for 60 seconds was heat-treated at 25° C., 60° C., 90° C. and 120° C., and then the sample was analyzed using a UV-Vis absorption spectrometer.

Figure 6:
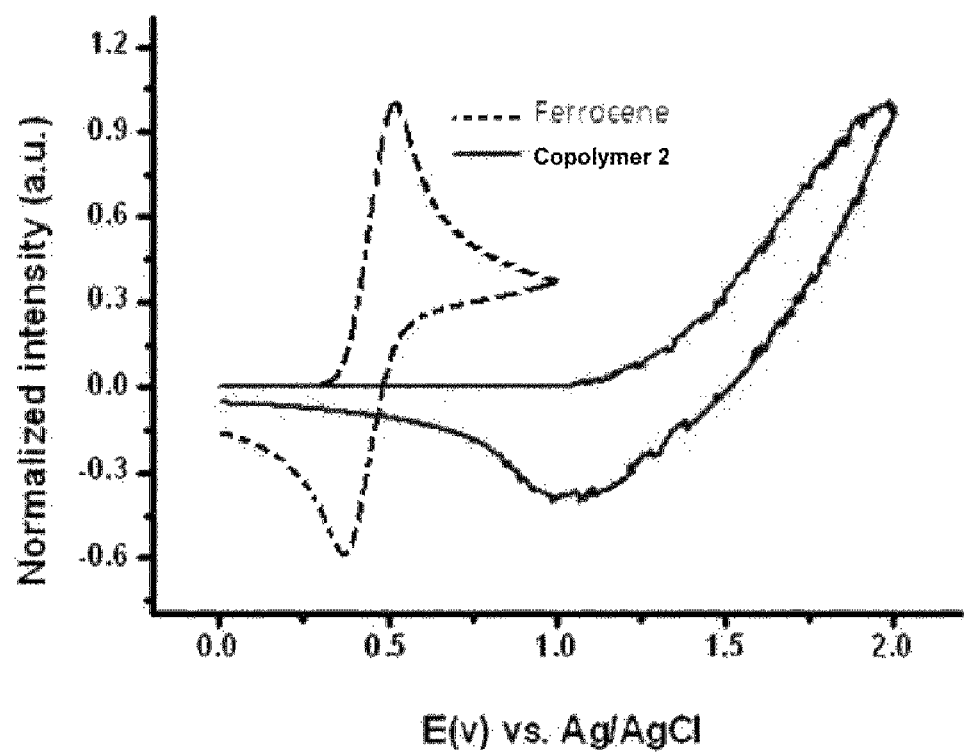
FIG. 6 is a diagram showing cyclic voltammetry of the compound by Example 4.

FIG. 6 is a diagram showing cyclic voltammetry of the compound by Example 4.

As the cyclic voltammetry measurement of FIG. 6, a three electrode method, in which a glassy carbon working electrode, an Ag/AgCl reference electrode and a Pt electrode were immersed in an electrolyte solution in which $Bu_4NBF_4$ was dissolved in acetonitrile in a concentration of 0.1 M, was used. The compound was coated on a working electrode using a drop casting method.

Example 5

Polymer Polymerization (Polymerization of Copolymer 3)

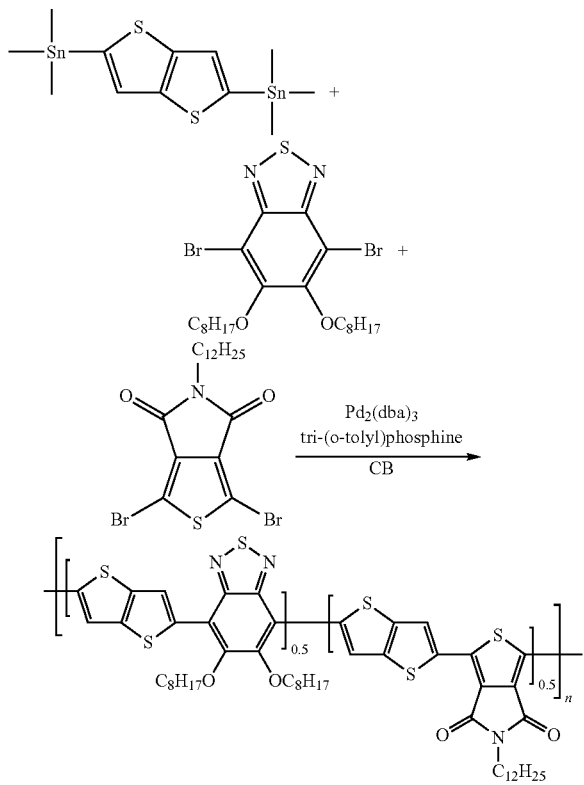

In a microwave reactor vial, chlorobenzene (15 ml), 2,5-bis-trimethylstannyl-thieno[3,2-b]thiophene (0.6 g, 1.29 mmol), 4,7-dibromo-5,6-bis(octyloxy)benzo[c]-1,2,5-thiadiazole (0.3545 g, 0.644 mmol), 1,3-dibromo-5-dodecylthieno[3,4-c]pyrrole-4,6-dione (0.3086 g, 0.644 mmol), tris(dibenzylideneacetone)dipalladium(0) (Pd$_2$(dba)$_3$, 35 mg), and tri-(o-tolyl)phosphine (47 mg) were placed, and the mixture was reacted for 1 hour at 170° C. After the mixture was cooled to room temperature and poured into methanol, the solid was filtered and then Soxhlet-extracted with acetone, hexane and chloroform. The chloroform portion was precipitated again in methanol, and the solid was filtered.

Yield: 48%

Number-average molecular weight: 6,600 g/mol

Weight-average molecular weight: 33,400 g/mol

Figure 7:
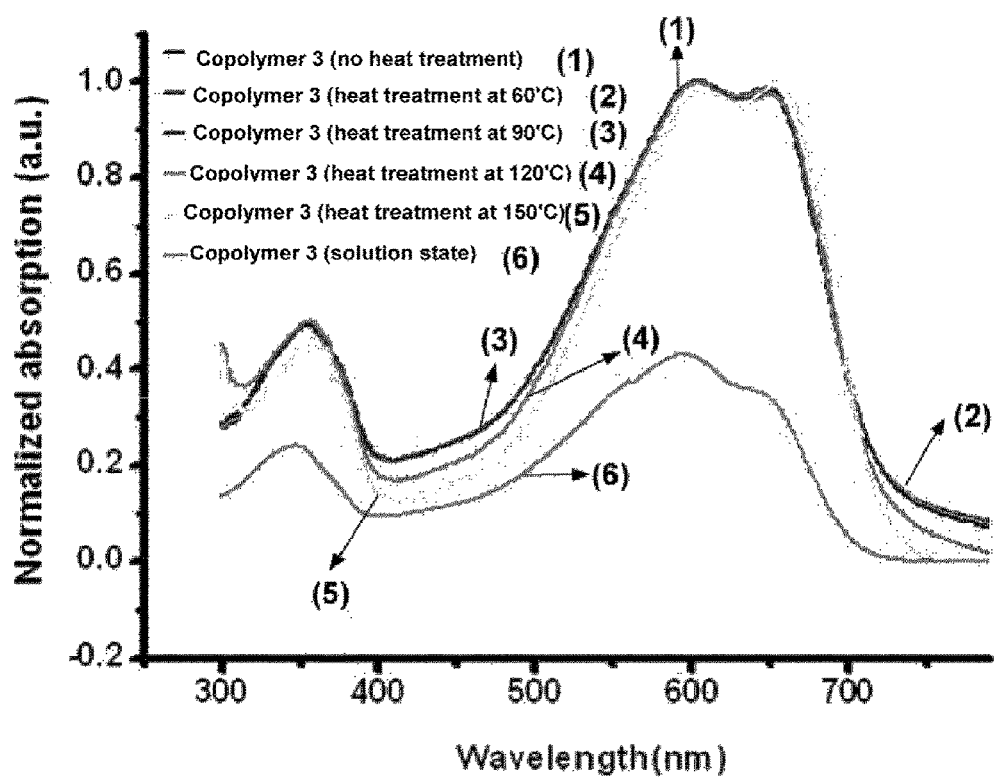
FIG. 7 is a diagram showing a film-phase UV-Vis absorption spectrum of Copolymer 3 by Example 5 heat-treated with a toluene solution.

FIG. 7 is a diagram showing a film-phase UV-Vis absorption spectrum of Copolymer 3 by Example 5 heat-treated with a toluene solution.

As the film-phase UV absorption spectrum of FIG. 7, the compound was dissolved in chlorobenzene in a concentration of 1 wt %, and after this solution was dropped on a glass substrate, the sample spin-coated at 1000 rpm for seconds was heat-treated at 25° C., 60° C., 90° C., 120° C. and 150° C., and then the sample was analyzed using a UV-Vis absorption spectrometer.

Figure 8:
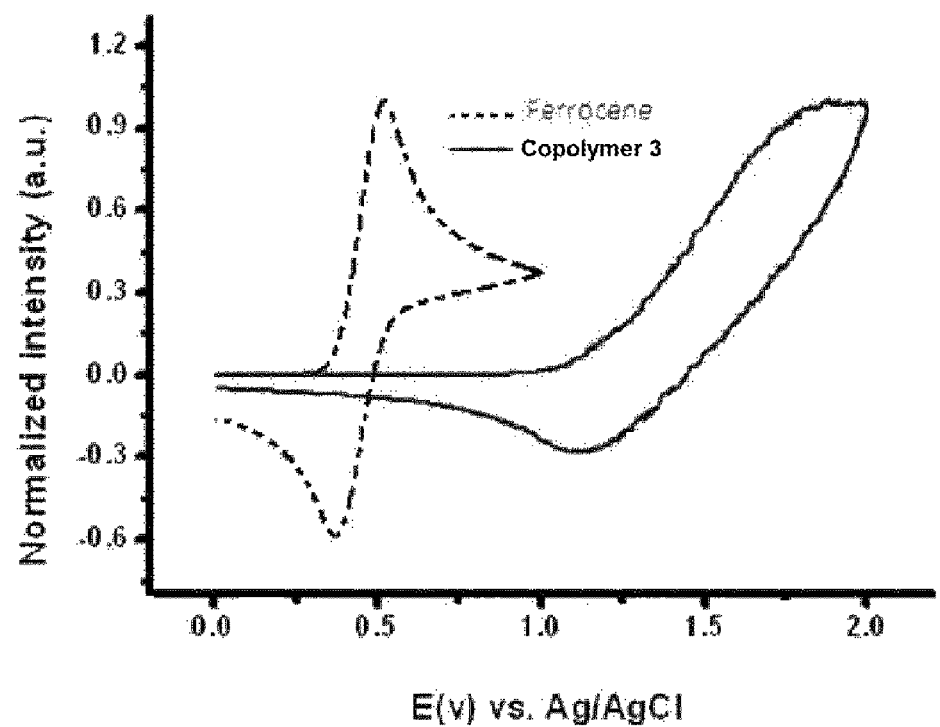
FIG. 8 is a diagram showing cyclic voltammetry of the compound by Example 5.

FIG. 8 is a diagram showing cyclic voltammetry of the compound by Example 5.

As the cyclic voltammetry measurement of FIG. 8, a three electrode method, in which a glassy carbon working electrode, an Ag/AgCl reference electrode and a Pt electrode were immersed in an electrolyte solution in which Bu$_4$NBF$_4$ was dissolved in acetonitrile in a concentration of 0.1 M, was used. The compound was coated on a working electrode using a drop casting method.

Manufacture of Organic Solar Cell and Characteristics Measurements Thereof

Preparation Example 1. Manufacture of Organic Solar Cell-1

A composite solution was prepared by dissolving the compound prepared in Example 3 and PCBM in the ratio of 1:2 in chlorobenzene (CB). At this time, the concentration was adjusted to be 2.0 wt %, and the structure of an organic solar cell employed an ITO/PEDOT:PSS/photoactive layer/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 nm, and then heat treated for 10 minutes at 120° C. For coating of the photoactive layer, the compound-PCBM composite solution was filtered using a PP syringe filter of 0.45 μm, then spin-coated, and then deposited with Al to a thickness of 200 nm using a thermal evaporator under the vacuum of $3 \times 10^{-8}$ torr, and as a result, the organic solar cell was manufactured.

Preparation Example 2. Manufacture of Organic Solar Cell-2

A composite solution was prepared by dissolving the compound prepared in Example 4 and PCBM in the ratio of 1:2 in chlorobenzene (CB). At this time, the concentration was adjusted to be 2.0 wt %, and the structure of an organic solar cell employed an ITO/PEDOT:PSS/photoactive layer/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 nm, and then heat treated for 10 minutes at 120° C. For coating of the photoactive layer, the compound-PCBM composite solution was filtered using a PP syringe filter of 0.45 μm, then spin-coated, and then deposited with Al to a thickness of 200 nm using a thermal evaporator under the vacuum of $3 \times 10^{-8}$ torr, and as a result, the organic solar cell was manufactured.

Preparation Example 3. Manufacture of Organic Solar Cell-3

A composite solution was prepared by dissolving the compound prepared in Example 5 and PCBM in the ratio of 1:3 in chlorobenzene (CB). At this time, the concentration was adjusted to be 2.0 wt %, and the structure of an organic solar cell employed an ITO/PEDOT:PSS/photoactive layer/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 nm, and then heat treated for 10 minutes at 120° C. For coating of the photoactive layer, the compound-PCBM composite solution was filtered using a PP syringe filter of 0.45 μm, then spin-coated, and then deposited with Al to a thickness of 200 nm using a thermal evaporator under the vacuum of $3 \times 10^{-8}$ torr, and as a result, the organic solar cell was manufactured.

Comparative Example 1. Manufacture of Organic Solar Cell-4

A composite solution was prepared by dissolving P3HT and PCBM in the ratio of 1:1 in 1,2-dichlorobenzene (DCB). At this time, the concentration was adjusted to be 1.0 wt % to 2.0 wt %, and the structure of an organic solar cell employed an ITO/PEDOT:PSS/photoactive layer/LiF/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 cm, and then heat treated for 10 minutes at 120° C. For coating of the photoactive layer, the P3HT-PCBM composite solution was filtered using a PP syringe filter of 0.45 μm, spin-coated, heat treated for 5 minutes at 120° C., and deposited with LiF to a thickness of 7 Å and then Al to a thickness of 200 nm using a thermal evaporator under the vacuum of $3 \times 10^{-8}$ torr, and as a result, the organic solar cell was manufactured.

Experimental Example 1

Photoelectric transformation characteristics of the organic solar cell manufactured in Preparation Examples 1 to 3 and Comparative Example 1 were measured under the condition of 100 mW/cm² (AM 1.5), and the results thereof are shown in the following Table 1.

TABLE 1

| | Active Layer | $V_{oc}$ (V) | $J_{sc}$ (mA/cm²) | FF | PCE (%) |
|---|---|---|---|---|---|
| Preparation Example 1 | copolymer 1/PC$_{61}$BM = 1:2 | 0.81 | 9.65 | 53.3 | 4.13 |
| Preparation Example 2 | copolymer 2/PC$_{61}$BM = 1:2 | 0.77 | 8.95 | 54.3 | 3.75 |
| Preparation Example 3 | copolymer 3/PC$_{61}$BM = 1:3 | 0.50 | 5.02 | 32.3 | 0.81 |
| Comparative Example 1 | P3HT/ PC$_{61}$BM = 1:1 | 0.72 | 8.30 | 45.5 | 2.81 |

In Table 1, $V_{oc}$ means an open circuit voltage, $J_{sc}$ a short-circuit current, FF a fill factor, and PCE an energy conversion efficiency. The open circuit voltage and the short-circuit current is an X axis and an Y axis intercept, respectively, in the fourth quadrant of the voltage-current density curve, and as these two values increase, the solar cell efficiency preferably increases. In addition, the fill factor is a value that the area of a rectangle, which can be drawn within the curve, is divided by the multiple of the short-circuit current and the open circuit voltage. The energy conversion efficiency can be determined when these three values are divided by the irradiated light intensity, and it is preferable as the efficiency value becomes higher.

Figure 9:
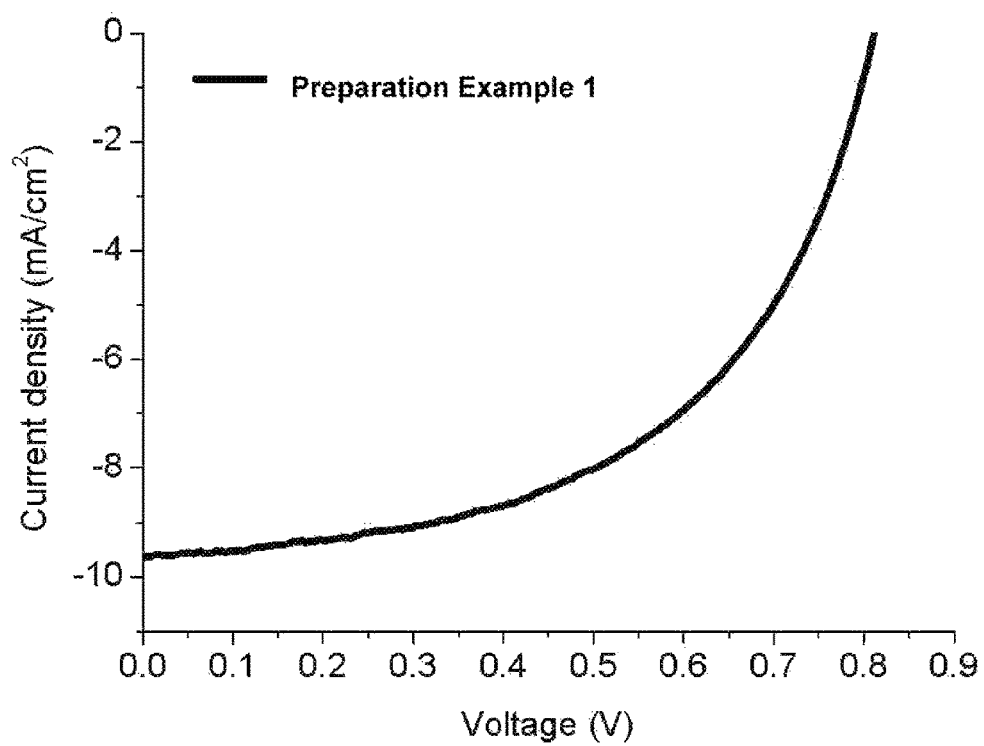
FIG. 9 is a diagram showing current density depending on the solar cell voltage of an organic solar cell device using Copolymer 1 prepared according to Preparation Example 1.

FIG. 9 is a diagram showing current density depending on the solar cell voltage of the organic solar cell device using Copolymer 1 prepared according to Preparation Example 1.

Figure 10:
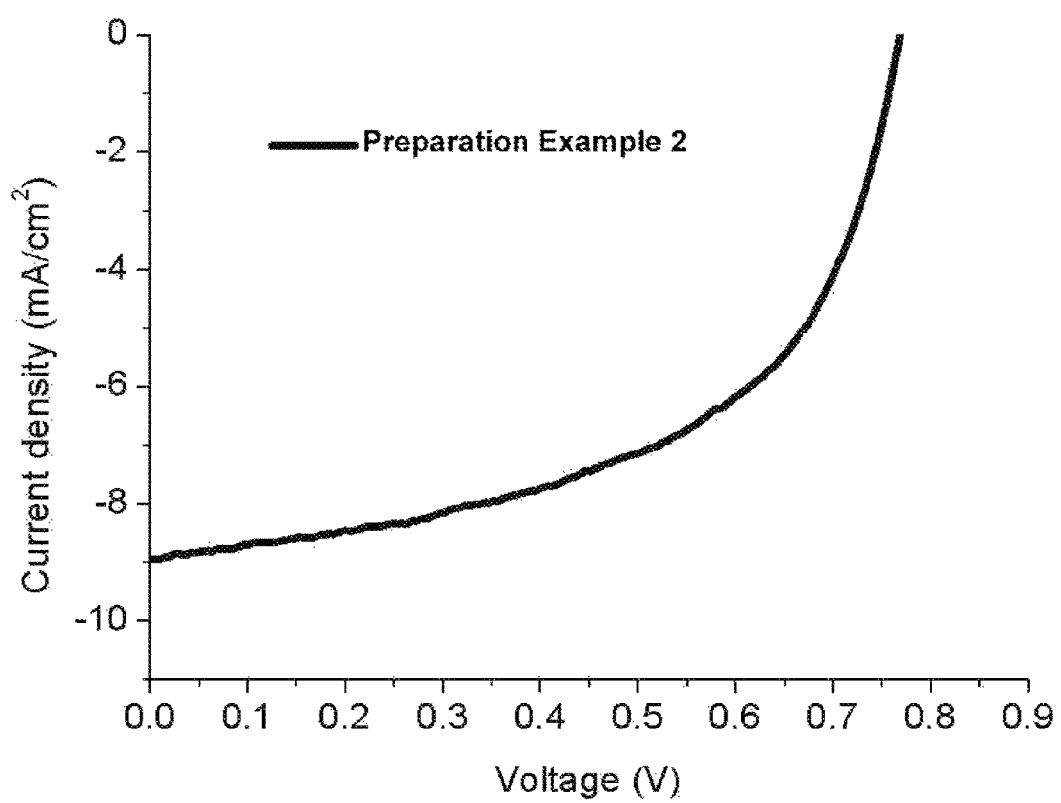
FIG. 10 is a diagram showing current density depending on the solar cell voltage of an organic solar cell device using Copolymer 2 prepared according to Preparation Example 2.

FIG. 10 is a diagram showing current density depending on the solar cell voltage of the organic solar cell device using Copolymer 2 prepared according to Preparation Example 2.

Figure 11:
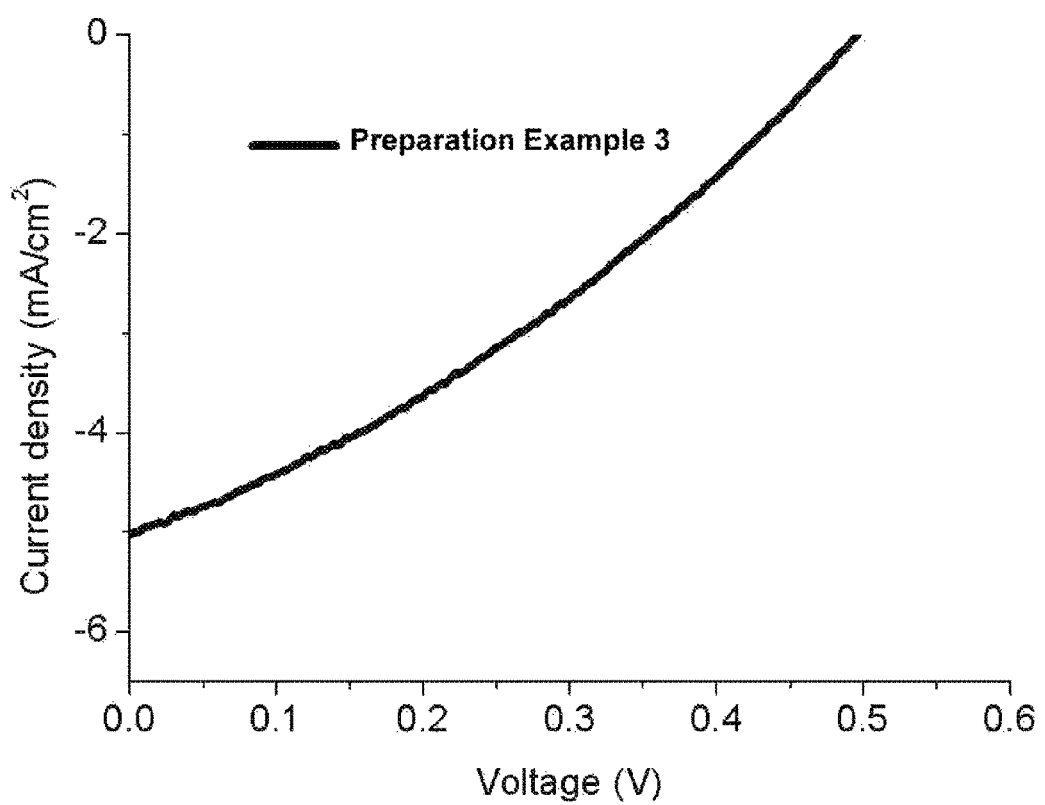
FIG. 11 is a diagram showing current density depending on the solar cell voltage of an organic solar cell device using Copolymer 3 prepared according to Preparation Example 3.

FIG. 11 is a diagram showing current density depending on the solar cell voltage of the organic solar cell device using Copolymer 3 prepared according to Preparation Example 3.

What is claimed is:
1. A copolymer comprising:
an A unit represented by any one of the following Chemical Formulae 1 to 3;
a B unit represented by the following Chemical Formula 4; and
a C unit represented by the following Chemical Formula 5:

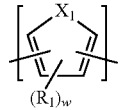

[Chemical Formula 1]

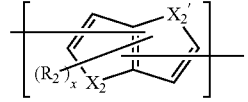

[Chemical Formula 2]

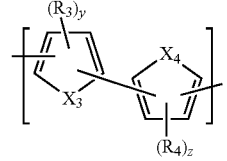

[Chemical Formula 3]

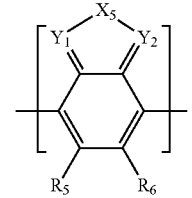

[Chemical Formula 4]

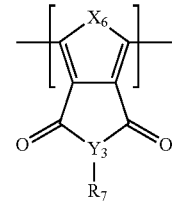

[Chemical Formula 5]

wherein, in Chemical Formulae 1 to 5,
w, x, y and z are each an integer of 0 to 2;
$X_1$ to $X_6$ and $X_2'$ are the same as or different from each other, and each independently selected from the group consisting of CRR', NR, O, SiRR', PR, S, GeRR', Se and Te;
$Y_1$ to $Y_3$ are the same as or different from each other, and each independently selected from the group consisting of CR, N, SiR, P and GeR;
R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;

$R_1$ to $R_4$ and $R_7$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;

$R_5$ is selected from the group consisting of a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms; and $R_6$ is selected from the group consisting of a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

2. The copolymer of claim 1, wherein $X_1$ to $X_4$, $X_6$ and $X_2'$ are the same as or different from each other, and each independently S, O or Se.

3. The copolymer of claim 1, wherein the A unit represented by any one of Chemical Formulae 1 to 3 is represented by the following Chemical Formula 11, 21 or 31:

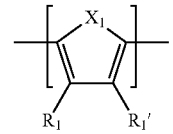

[Chemical Formula 11]

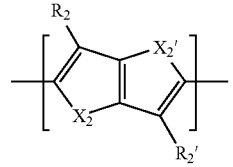

[Chemical Formula 21]

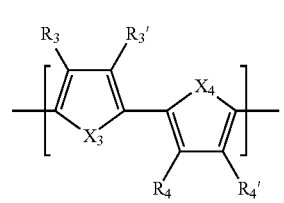

[Chemical Formula 31]

wherein, in Chemical Formulae 11, 21 and 31:

$X_1$ to $X_4$, $X_2'$, and $R_1$ to $R_4$ are the same as those defined in Chemical Formulae 1 to 3;

$R_1'$ has the same definition as $R_1$;

$R_2'$ has the same definition as $R_2$;

$R_3'$ has the same definition as $R_3$; and $R_4'$ has the same definition as $R_4$.

4. The copolymer of claim 1, wherein:

$X_5$ is NR or S; and $Y_1$ and $Y_2$ are N.

5. A copolymer comprising:

an A unit represented by any one of the following Chemical Formulae 1 to 3;

a B unit represented by the following Chemical Formula 4; and a C unit represented by the following Chemical Formula 5:

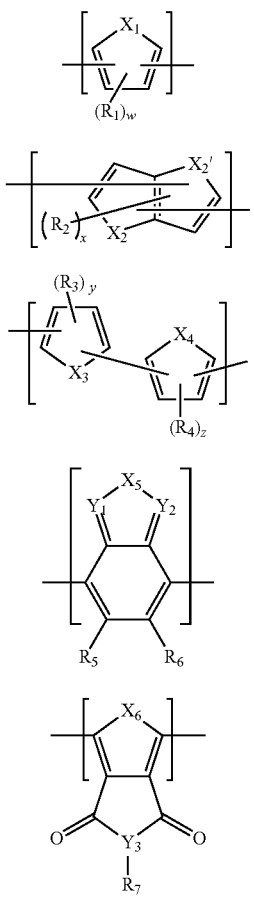

[Chemical Formula 1]

[Chemical Formula 2]

[Chemical Formula 3]

[Chemical Formula 4]

[Chemical Formula 5]

wherein, in Chemical Formulae 1 to 5:
x, y and z are each an integer of 0 to 2;
$X_1$ to $X_6$ and $X_2'$ are the same as or different from each other, and each independently selected from the group consisting of CRR', NR, O, SiRR', PR, S, GeRR', Se and Te;
$Y_1$ to $Y_3$ are the same as or different from each other, and each independently selected from the group consisting of CR, N, SiR, P and GeR;
R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;
$R_1$ to $R_4$ and $R_7$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring; and
$R_5$ and $R_6$ are the same as or different from each other, and each independently is a hydroxy group or a substituted or unsubstituted alkoxy group.

6. A copolymer comprising:
an A unit represented by any one of the following Chemical Formulae 1 to 3;
a B unit represented by the following Chemical Formula 4; and
a C unit represented by the following Chemical Formula 5:

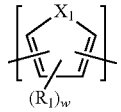

[Chemical Formula 1]

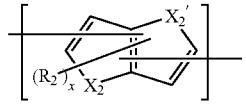

[Chemical Formula 2]

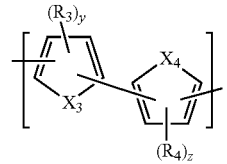

[Chemical Formula 3]

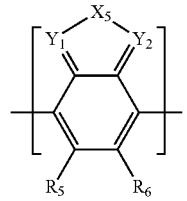

[Chemical Formula 4]

-continued

[Chemical Formula 5]

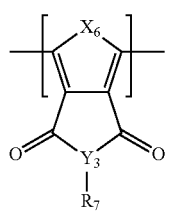

wherein, in Chemical Formulae 1 to 5, w, x, y and z are each an integer of 0 to 2;

$X_1$ to $X_4$, $X_6$ and $X_2'$ are the same as or different from each other, and each independently selected from the group consisting of CRR', NR, O, SiRR', PR, S, GeRR', Se and Te;

$X_5$ is NR or S;

$Y_1$ and $Y_2$ are N; and $Y_3$ is selected from the group consisting of CR, N, SiR, P and GeR;

R and R' are the same as or different from each other, and each independently selected from the group consisting of hydrogen; deuterium a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;

$R_1$ to $R_4$ and $R_7$ are the same as or different from each other, and each independently selected from the group consisting of hydrogen; deuterium a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring; and $R_5$ and $R_6$ are the same as or different from each other, and each independently a hydroxy group, or a substituted or unsubstituted alkoxy group.

7. The copolymer of claim 1, wherein:

$X_6$ is S, O or Se;

$Y_3$ is N; and $R_7$ is hydrogen or a substituted or unsubstituted alkyl group.

8. The copolymer of claim 1, further comprising:

a D unit that includes one, two or more selected from the group consisting of a substituted or unsubstituted aryl group and a substituted or unsubstituted heteroring group having 3 to 30 ring member carbon atoms.

9. The copolymer of claim 8, wherein the D unit includes one, two or more of the following chemical formulae:

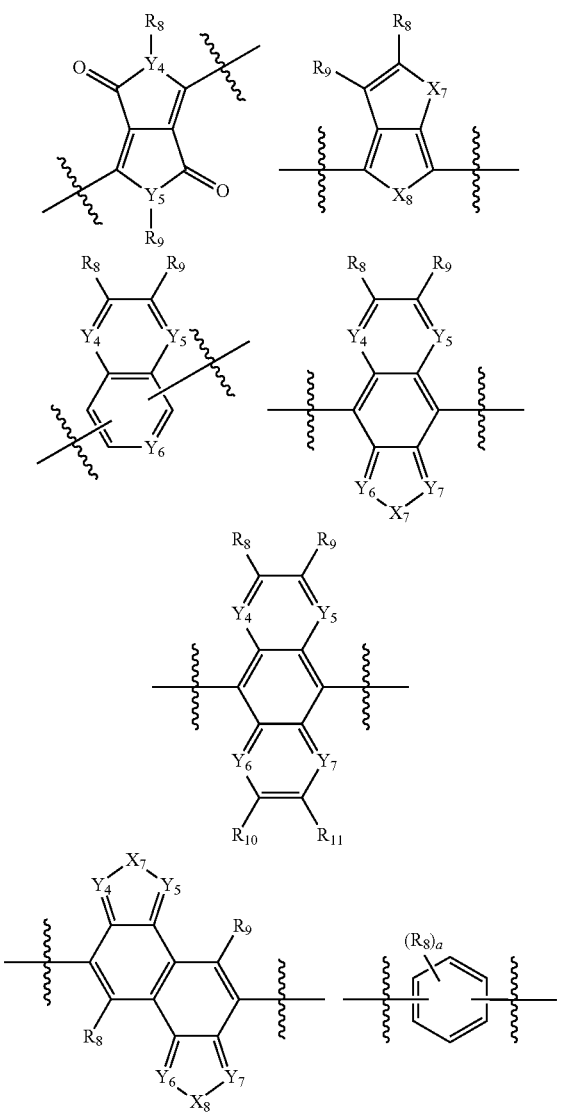

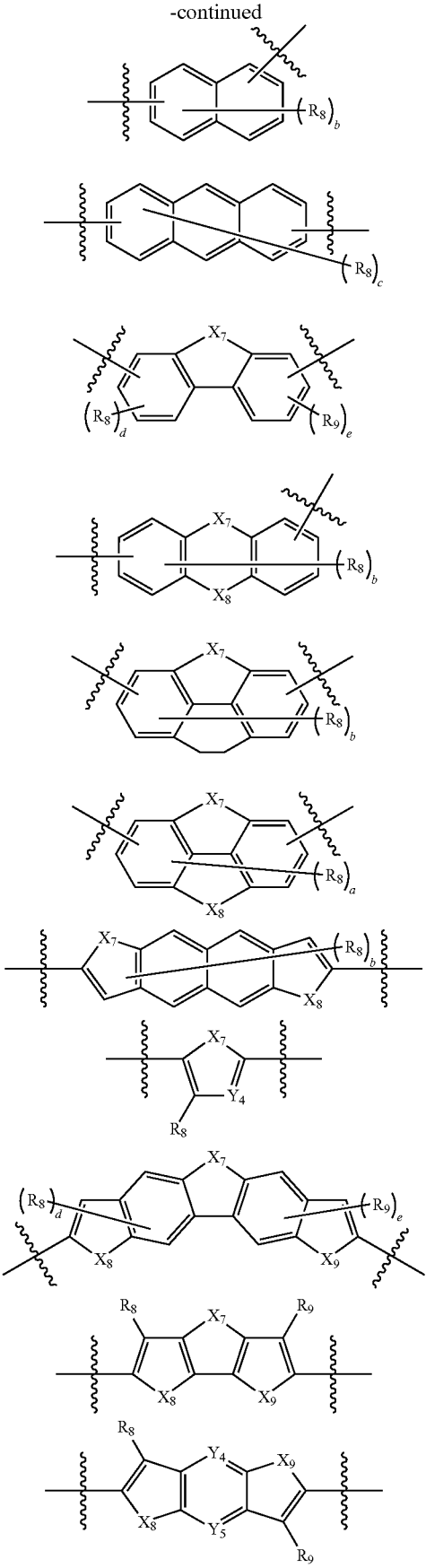

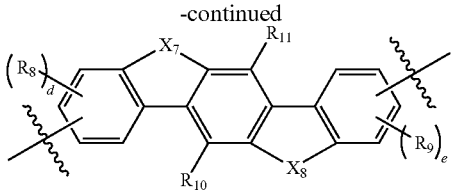

a is an integer of 0 to 4;
b is an integer of 0 to 6;
c is an integer of 0 to 8;
d and e are each an integer of 0 to 3;
$R_8$ to $R_{11}$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;
$X_7$ to $X_9$ are the same as or different from each other, and each independently selected from the group consisting of CRR', NR, O, SiRR', PR, S, GeRR', Se and Te;
$Y_4$ to $Y_7$ are the same as or different from each other, and each independently selected from the group consisting of CR, N, SiR, P and GeR; and
R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

10. The copolymer of claim 1, which is selected from the group consisting of a random copolymer, an alternative copolymer, a block copolymer, a graft copolymer and a starblock copolymer.

11. A random copolymer comprising:
an A unit represented by any one of the following Chemical Formulae 1 to 3;
a B unit represented by the following Chemical Formula 4; and
a C unit represented by the following Chemical Formula 5:

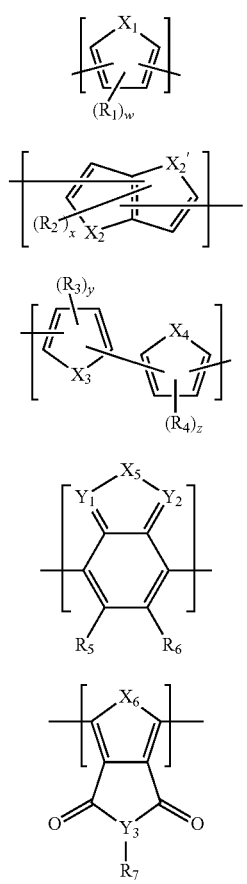

[Chemical Formula 1]

[Chemical Formula 2]

[Chemical Formula 3]

[Chemical Formula 4]

[Chemical Formula 5]

wherein, in Chemical Formulae 1 to 5:
x, y and z are each an integer of 0 to 2;
$X_1$ to $X_6$ and $X_2'$ are the same as or different from each other, and each independently selected from the group consisting of CRR', NR, O, SiRR', PR, S, GeRR', Se and Te;
$Y_1$ to $Y_3$ are the same as or different from each other, and each independently selected from the group consisting of CR, N, SiR, P and GeR;
R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;
$R_1$ to $R_4$ and $R_7$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;
$R_5$ is selected from the group consisting of hydrogen; deuterium; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms; and
$R_6$ is selected from the group consisting of deuterium; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

12. The copolymer of claim 1, which includes a structure represented by the following Chemical Formula 6:

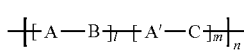

[Chemical Formula 6]

wherein, in Chemical Formula 6,
l is a molar fraction and a real number of $0<l<1$;
m is a molar fraction and a real number of $0<m<1$, and $l+m=1$;
n is an integer of 1 to 10,000;
A and A' are the same as or different from each other, and each independently any one of Chemical Formulae 1 to 3;
B is Chemical Formula 4; and
C is Chemical Formula 5.

13. The copolymer of claim 1, which includes a structure represented by the following Chemical Formula 7:

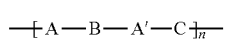

[Chemical Formula 7]

wherein, in Chemical Formula 7;
n is an integer of 1 to 10,000;
A and A' are the same as or different from each other, and each independently any one of Chemical Formulae 1 to 3;
B is Chemical Formula 4; and
C is Chemical Formula 5.

14. The copolymer of claim 1, which includes a structure represented by the following Chemical Formula 8:

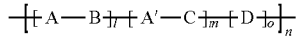

[Chemical Formula 8]

wherein, in Chemical Formula 8,
l is a molar fraction and a real number of $0<l<1$;
m is a molar fraction and a real number of $0<m<1$;
o is a molar fraction and a real number of $0\leq o<1$, and $l+m+o=1$;
n is an integer of 1 to 10,000;
A and A' are the same as or different from each other, and each independently any one of Chemical Formulae 1 to 3;
B is Chemical Formula 4;
C is Chemical Formula 5;
D includes one, two or more of the following Chemical Formulae;

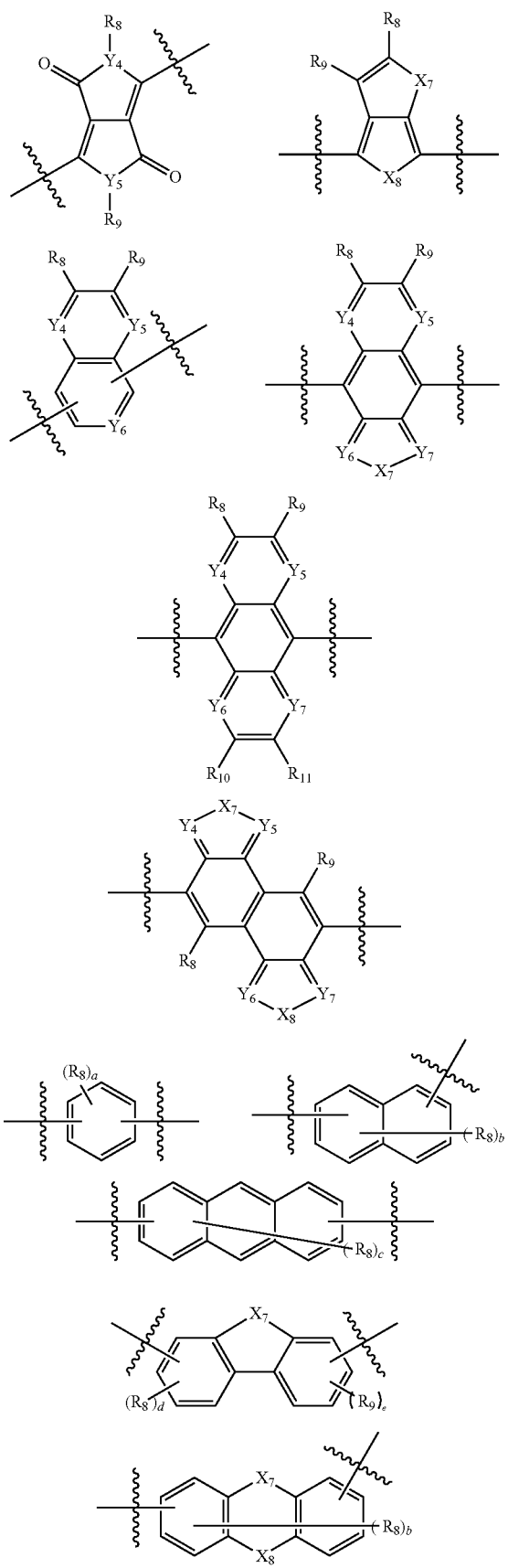

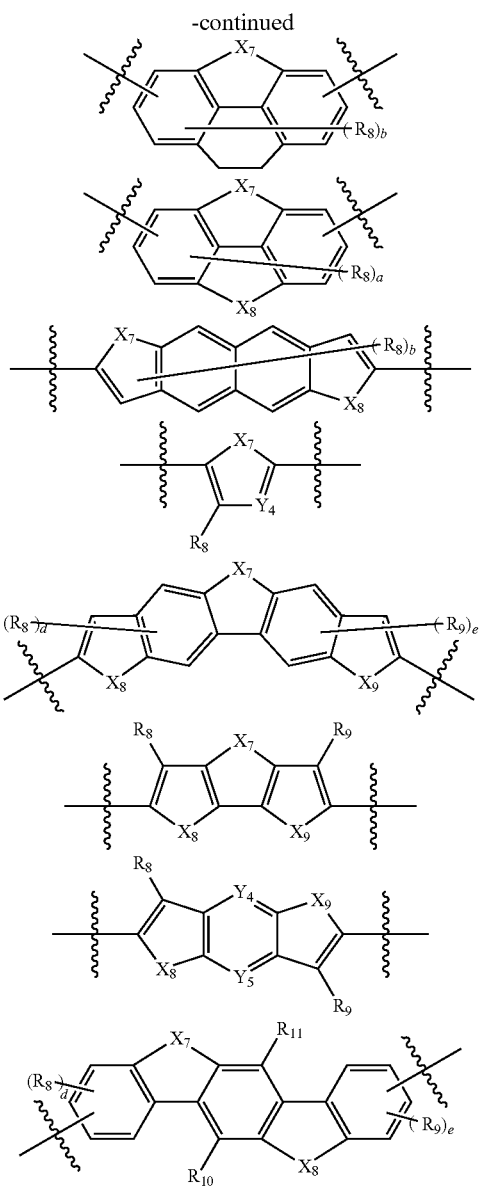

a is an integer of 0 to 4;
b is an integer of 0 to 6;
c is an integer of 0 to 8;
d and e are each an integer of 0 to 3;
$R_8$ to $R_{11}$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms, or two adjacent substituents are bonded to each other to form a hydrocarbon ring or a heteroring;

$X_7$ to $X_9$ are the same as or different from each other, and each independently selected from the group consisting of CRR', NR, O, SiRR', PR, S, GeRR', Se and Te;

$Y_4$ to $Y_7$ are the same as or different from each other, and each independently selected from the group consisting of CR, N, SiR, P and GeR; and R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl sulfoxide group; a substituted or unsubstituted aryl sulfoxide group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heteroring group including one or more of N, O and S atoms.

15. The copolymer of claim 1, wherein a content of the A unit is greater than or equal to 50 mol % and less than 100 mol % with respect to the total content of the copolymer, a content of the B+C units is greater than 0 mol % and less than or equal to 50 mol % with respect to the total content of the copolymer, and a ratio of the B unit with respect to the C unit is greater than 0.01 and less than or equal to 1.

16. The copolymer of claim 1, wherein an end group of the copolymer is a 4-(trifluoromethyl)phenyl group.

17. The copolymer of claim 1, wherein a number-average molecular weight of the copolymer ranges from 500 to 1,000,000 g/mol.

18. The copolymer of claim 1, wherein a molecular weight distribution of the copolymer ranges from 1 to 100.

19. An organic solar cell comprising:
a first electrode;
a second electrode provided opposite to the first electrode; and
one or more layers of organic material layers including a photoactive layer, which are provided between the first electrode and the second electrode,
wherein one or more layers of the organic material layers include the copolymer according to claim 1.

20. The organic solar cell of claim 19, wherein the organic material layer is a photoactive layer, the photoactive layer includes one, two or more selected from the group consisting of an electron donor and an electron acceptor, and the electron donor is the copolymer.

* * * * *